(12) United States Patent
Kim et al.

(10) Patent No.: US 10,992,281 B2
(45) Date of Patent: Apr. 27, 2021

(54) BULK ACOUSTIC WAVE RESONATOR AND METHOD OF MANUFACTURING THE SAME

(71) Applicant: Samsung Electro-Mechanics Co., Ltd., Suwon-si (KR)

(72) Inventors: Yong Suk Kim, Suwon-si (KR); Moon Chul Lee, Suwon-si (KR); Sung Jun Lee, Suwon-si (KR); Chang Hyun Lim, Suwon-si (KR); Jae Hyoung Gil, Suwon-si (KR); Sang Hyun Yi, Suwon-si (KR)

(73) Assignee: Samsung Electro-Mechanics Co., Ltd., Suwon-si (KR)

(\*) Notice: Subject to any disclaimer, the term of this patent is extended or adjusted under 35 U.S.C. 154(b) by 51 days.

(21) Appl. No.: 16/400,052

(22) Filed: May 1, 2019

(65) Prior Publication Data
US 2019/0356293 A1    Nov. 21, 2019

(30) Foreign Application Priority Data

May 17, 2018  (KR) .................. 10-2018-0056702
Aug. 27, 2018  (KR) .................. 10-2018-0100330

(51) Int. Cl.
| | |
|---|---|
| *H03H 9/02* | (2006.01) |
| *H03H 9/13* | (2006.01) |
| *H03H 3/02* | (2006.01) |
| *H03H 9/17* | (2006.01) |
| *H03H 9/54* | (2006.01) |
| *H03H 3/04* | (2006.01) |

(52) U.S. Cl.
CPC .......... *H03H 9/02086* (2013.01); *H03H 3/02* (2013.01); *H03H 9/132* (2013.01);
(Continued)

(58) Field of Classification Search
CPC ...... H03H 9/02086; H03H 3/02; H03H 9/174; H03H 9/132; H03H 9/54;
(Continued)

(56) References Cited

U.S. PATENT DOCUMENTS

| 7,709,999 B2 | 5/2010 | Itaya et al. |
|---|---|---|
| 2008/0169728 A1 | 7/2008 | Asai et al. |

(Continued)

FOREIGN PATENT DOCUMENTS

| JP | 2000-201041 A | 7/2000 |
|---|---|---|
| JP | 2007-288645 A | 11/2007 |

(Continued)

OTHER PUBLICATIONS

Korean Office Action dated Jul. 18, 2019 in counterpart Korean Patent Application No. 10-2018-0100330 (7 pages in English and 6 pages in Korean).

*Primary Examiner* — Robert J Pascal
*Assistant Examiner* — Jorge L Salazar, Jr.
(74) *Attorney, Agent, or Firm* — NSIP Law

(57) ABSTRACT

A bulk acoustic wave resonator includes a substrate; a lower electrode disposed on the substrate; a piezoelectric layer disposed to cover at least a portion of the lower electrode; an upper electrode disposed to cover at least a portion of the piezoelectric layer; and a passivation layer disposed to cover at least a portion of the upper electrode, wherein the passivation layer includes a non-trimming-processed portion disposed outside an active region of the bulk acoustic wave resonator in which portions of the lower electrode, the piezoelectric layer, and the upper electrode overlap, and having a thickness that is thicker than a thickness of a portion of the passivation layer disposed in the active region.

22 Claims, 27 Drawing Sheets

(52) U.S. Cl.
CPC .............. *H03H 9/174* (2013.01); *H03H 9/54* (2013.01); *H03H 2003/0442* (2013.01)

(58) Field of Classification Search
CPC ........... H03H 2003/0442; H03H 9/175; H03H 9/173; H03H 2003/021; H03H 3/04; H03H 9/0014; H03H 9/02; H03H 2003/023; H03H 2009/02173
USPC .................................................. 333/187, 188
See application file for complete search history.

(56) References Cited

U.S. PATENT DOCUMENTS

| | | |
|---|---|---|
| 2009/0033177 A1 | 2/2009 | Itaya et al. |
| 2016/0126930 A1* | 5/2016 | Zou ....................... H01L 41/047 333/187 |
| 2017/0033769 A1* | 2/2017 | Yokoyama ............. H03H 9/175 |
| 2018/0013401 A1 | 1/2018 | Lee et al. |
| 2018/0019726 A1 | 1/2018 | Han et al. |
| 2019/0245515 A1* | 8/2019 | Hurwitz ................. H03H 9/205 |

FOREIGN PATENT DOCUMENTS

| | | |
|---|---|---|
| JP | 2008-172713 A | 7/2008 |
| JP | 4435049 B2 | 3/2010 |
| KR | 10-2004-0089914 A | 10/2004 |
| KR | 10-2007-0067008 A | 6/2007 |
| KR | 10-2018-0006248 A | 1/2018 |
| KR | 10-2018-0008259 A | 1/2018 |

* cited by examiner

BULK ACOUSTIC WAVE RESONATOR AND METHOD OF MANUFACTURING THE SAME

CROSS-REFERENCE TO RELATED APPLICATIONS

This application claims the benefit under 35 USC 119(a) of Korean Patent Application Nos. 10-2018-0056702 filed on May 17, 2018, and 10-2018-0100330 filed on Aug. 27, 2018, in the Korean Intellectual Property Office, the entire disclosures of which are incorporated herein by reference for all purposes.

BACKGROUND

1. Field

This application relates to a bulk acoustic wave resonator, and a method of manufacturing the same.

2. Description of Related Art

A trimming operation for adjusting an operating frequency of a bulk acoustic wave (BAW) resonator is typically performed when manufacturing a BAW filter implemented with the BAW resonator. The trimming operation adjusts the operating frequency of the BAW resonator by adjusting thicknesses of films constituting the BAW resonator. The films may include a lower electrode, a piezoelectric layer, an upper electrode, and a passivation layer.

In particular, the trimming operation for adjusting a thickness of the passivation layer is important because it determines the final frequency characteristics of the BAW filter.

Before performing the trimming operation on the passivation layer, it is necessary to distinguish between a region in which the trimming operation is to be performed and a region in which the trimming operation is not to be performed.

The way the trimming operation is performed affects the performance of the BAW filter, in addition to an accuracy and a reproducibility of the trimming operation.

In the related art, the trimming operation is performed using a stencil mask as a trimming mask. However, using the stencil mask has disadvantages of high production costs and undesirable effects occurring during the trimming operation.

Furthermore, an accuracy of an alignment between the BAW resonator and the stencil mask and a reproducibility of the trimming operation may be low, an ion beam shadow effect may occur due to a gap between the BAW resonator and the stencil mask, and an ion beam path may be distorted due to exposure of layers other than a layer to be trimmed. Therefore, the trimming operation using the stencil mask of the related art is disadvantageous in terms of the accuracy of the alignment and the reproducibility of the trimming operation, and a freedom of design of the BAW resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate; a lower electrode disposed on the substrate; a piezoelectric layer disposed to cover at least a portion of the lower electrode; an upper electrode disposed to cover at least a portion of the piezoelectric layer; and a passivation layer disposed to cover at least a portion of the upper electrode, wherein the passivation layer includes a non-trimming-processed portion disposed outside an active region of the bulk acoustic wave resonator in which portions of the lower electrode, the piezoelectric layer, and the upper electrode overlap, and having a thickness that is thicker than a thickness of a portion of the passivation layer disposed in the active region.

The portion of the passivation layer disposed in the active region may have a uniform thickness.

The passivation layer may further include a connection region connecting the portion of the passivation layer disposed in the active region to the non-trimming-processed portion of the passivation layer, and a width of the connection region may be 1 µm or less.

The bulk acoustic wave resonator may further include a metal pad disposed at least on a portion of the lower electrode or a portion of the upper electrode, and the non-trimming-processed portion may be disposed between the metal pad and the active region.

The passivation layer may be a dielectric layer including any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The non-trimming-processed portion may be disposed to surround the active region.

The bulk acoustic wave resonator may further include an insertion layer disposed between the lower electrode and the piezoelectric layer.

The bulk acoustic wave resonator may further include a cavity disposed between the active region and the substrate, and an etching prevention portion disposed to surround the cavity.

The bulk acoustic wave resonator may further include a sacrificial layer disposed to surround the etching prevention portion.

The non-trimming-processed portion may be adapted to be covered by a photoresist (PR) trimming mask formed of a photoresist during a trimming operation performed on the portion of the passivation layer disposed in the active region.

The bulk acoustic wave resonator may further include a gap disposed between the piezoelectric layer and the upper electrode, and the active region may extend to an end of the gap closest to a center of the bulk acoustic wave resonator.

The piezoelectric layer may include an etching groove disposed outside the active region.

The substrate may include a cavity-forming groove that forms a cavity under the active region.

The lower electrode, the piezoelectric layer, and the upper electrode may have a bent shape in the active region.

The substrate and a portion of the lower electrode having the bent shape form a cavity together.

The bulk acoustic wave resonator may further include a reflection layer disposed on the substrate under the active region or in a groove formed in the substrate under the active region.

The reflection layer may include a first reflection member and a second reflection member disposed on the first reflection member, or the reflection layer may include a plurality of first reflection members and a plurality of second reflection members disposed in a stack so that the first reflection members alternate with the second reflection members with one of the first reflection members being disposed at one end of the stack and one of the second reflection members being disposed at an opposite end of the stack.

In another general aspect, in a method of manufacturing a bulk acoustic wave resonator, the bulk acoustic wave resonator including a substrate, a lower electrode disposed to cover at least a portion of the substrate, a piezoelectric layer disposed to cover at least a portion of the lower electrode, an upper electrode disposed to cover at least a portion of the piezoelectric layer, and a passivation layer disposed to cover at least a portion of the upper electrode, the method includes forming a photoresist (PR) trimming mask of a photoresist on a portion of the passivation layer disposed in a region of the bulk acoustic wave resonator in which a trimming operation is not to be performed on the passivation layer; trimming a portion of the passivation layer disposed in a region of the bulk acoustic wave resonator in which the trimming operation is to be performed on the passivation layer; and removing the PR trimming mask.

In another general aspect, a bulk acoustic wave resonator includes a substrate; a lower electrode disposed on at least a portion of the substrate; a piezoelectric layer disposed on at least a portion of the lower electrode; an upper electrode disposed on at least a portion of the piezoelectric layer; and a passivation layer disposed on at least a portion of the upper electrode, wherein portions of the lower electrode, the piezoelectric layer, and the upper electrode overlap to form an active region of the bulk acoustic wave resonator, the passivation layer includes a first portion disposed outside the active region and having a first thickness; and a second portion disposed in the active region and having a second thickness less than the first thickness, and a transition between the first thickness and the second thickness occurs over a distance that is sufficiently small to prevent an abnormal region of amplitude fluctuation caused by the transition from occurring in a resonator waveform of the bulk acoustic wave resonator.

The transition between the first thickness and the second thickness may occur over a distance that is substantially equal to zero so that there is a step difference between the first thickness and the second thickness.

The transition between the first thickness and the second thickness may occur over a distance of 1 µm or less.

The second thickness may determine an operating frequency of the bulk acoustic wave resonator.

In another general aspect, in a method of manufacturing a bulk acoustic wave resonator, the bulk acoustic wave resonator including a substrate, a lower electrode disposed on at least a portion of the substrate, a piezoelectric layer disposed on at least a portion of the lower electrode, an upper electrode disposed on at least a portion of the piezoelectric layer, and a passivation layer disposed on at least a portion of the upper electrode, wherein portions of the lower electrode, the piezoelectric layer, and the upper electrode overlap to form an active region of the bulk acoustic wave resonator, the method includes disposing a trimming mask on the bulk acoustic wave resonator so that there is no gap between the trimming mask and any portion of the bulk acoustic wave resonator on which the trimming mask is disposed, the trimming mask covers a first portion of the passivation layer disposed in a first region of the bulk acoustic wave resonator in which a trimming operation is not to be performed on the passivation layer, and the trimming mask does not cover a second portion of the passivation layer in a second region of the bulk acoustic wave resonator in which the trimming operation is to be performed on the passivation layer; trimming only the second portion of the passivation layer using the trimming mask; and removing the trimming mask.

The first portion of the passivation layer may be disposed outside the active region, and the second portion of the passivation layer may be disposed in the active region.

The disposing of the trimming mask may include forming the trimming mask of a photoresist on the bulk acoustic wave resonator by a photolithography process.

The trimming of only the second portion of the passivation layer may adjust an operating frequency of the bulk acoustic wave resonator by reducing a thickness of the second portion of the passivation layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
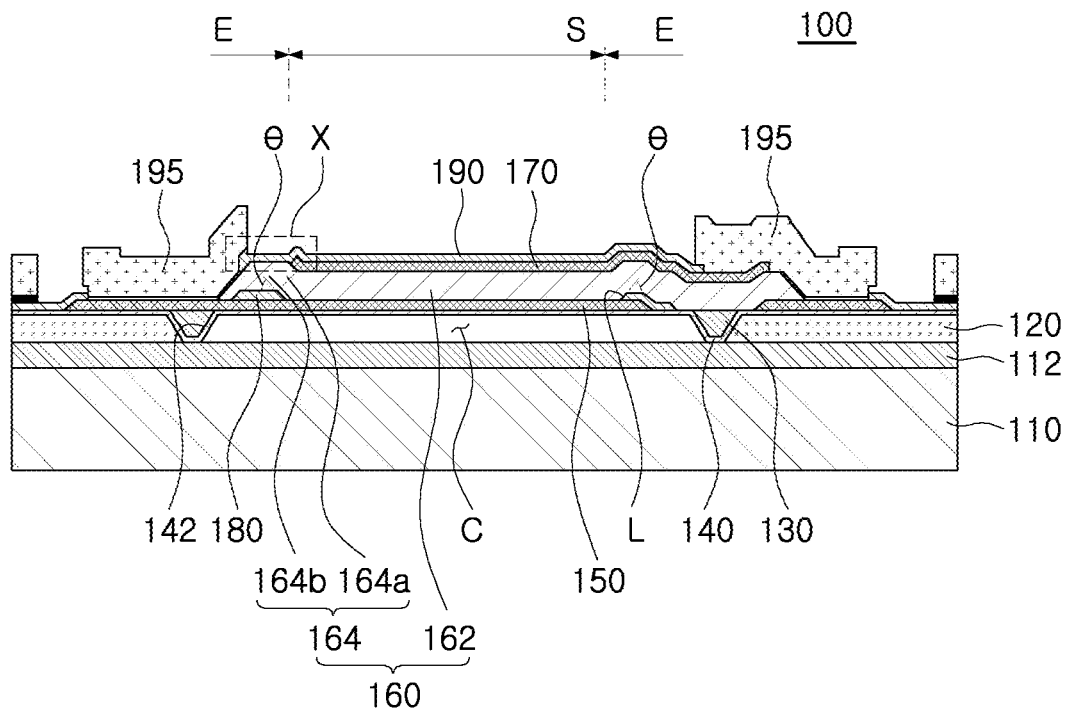
FIG. 1 is a schematic cross-sectional view illustrating an example of a bulk acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Figure 2:
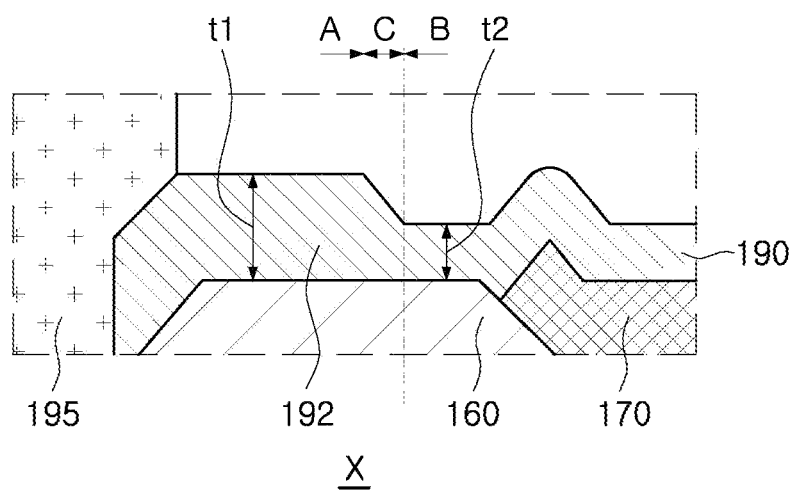
FIG. 2 is an enlarged view illustrating a portion X in FIG. 1.

FIG. 1 is a schematic cross-sectional view illustrating an example of a bulk acoustic wave resonator, and FIG. 2 is an enlarged view illustrating a portion X in FIG. 1.

Referring to FIGS. 1 and 2, a bulk acoustic wave resonator 100 includes a substrate 110, a sacrificial layer 120, an etching prevention portion 130, a membrane layer 140, a lower electrode 150, a piezoelectric layer 160, an upper electrode 170, an insertion layer 180, a passivation layer 190, and metal pads 195.

The substrate 110 may be a silicon substrate. For example, as the substrate 110, a silicon wafer may be used, or a silicon on insulator (SOI) type substrate may be used.

An insulation layer 112 is formed on an upper surface of the substrate 110, and electrically isolates the substrate 110 from elements formed above the substrate 110. The insulation layer 112 also prevents the substrate 110 from being etched by an etching gas used to form a cavity C during the manufacturing process.

The insulation layer 112 may be formed of any one or any combination of any two or more of silicon dioxide ($SiO_2$), silicon nitride ($Si_3N_4$), aluminum oxide ($Al_2O_3$), and aluminum nitride (AlN), and may be formed by any one or any combination of any two or more of a chemical vapor deposition process, a RF magnetron sputtering process, and an evaporation process.

The sacrificial layer 120 is formed on the insulation layer 112, and the cavity C and the etching prevention portion 130 are formed inside the sacrificial layer 120. The cavity C is formed by removing a portion of the sacrificial layer 120 during the manufacturing process using an etching gas. Since the cavity C is formed inside the sacrificial layer 120, the lower electrode 150 and other elements disposed above the sacrificial layer 120 are formed in a flat shape.

The etching prevention portion 130 is disposed along a boundary of the cavity C. The etching prevention portion 130 prevents etching from proceeding beyond a region of the cavity in the process of forming the cavity C by removing a portion of the sacrificial layer 120 using the etching gas.

The membrane layer 140 and the substrate 110 enclose the cavity C. The membrane layer 140 may be formed of a material having a low reactivity with the etching gas used to remove a portion of the sacrificial layer 120 to form the cavity C. The etching prevention portion 130 is formed in a groove 142 formed by the membrane layer 140. The membrane layer 140 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not illustrated) formed of aluminum nitride (AlN) may be formed on the membrane layer 140. For example, the seed layer may be disposed between the membrane layer 140 and the lower electrode 150. The seed layer may be formed of a dielectric or a metal having a hexagonal close packed (HCP) crystal structure in addition to aluminum nitride (AlN). For example, when the seed layer is a metal, the seed layer may be formed of titanium (Ti).

The lower electrode 150 is formed on the membrane layer 140 so that a portion of the lower electrode 150 is disposed above the cavity C. The lower electrode 150 may be used as either an input electrode or an output electrode for inputting or outputting an electrical signal such as a radio-frequency (RF) signal.

The lower electrode 150 may be formed of a conductive material such as molybdenum (Mo), or an alloy thereof. Alternatively, the lower electrode 150 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The piezoelectric layer 160 is formed to cover at least a portion of the lower electrode 150 disposed above the cavity C. The piezoelectric layer 160 is formed of a material exhibiting a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 160 is formed of aluminum nitride (AlN), the piezoelectric layer 160 may further include either one or both of a rare earth metal and a transition metal. For example, the rare earth metal may be any one or any combination of any two or more of scandium (Sc), erbium (Er), yttrium (Y), and lanthanum (La), and the transition metal may be any one or any combination of any two or more of titanium (Ti), zirconium (Zr), hafnium (Hf), tantalum (Ta), and niobium (Nb). The piezoelectric layer 160 may also include magnesium (Mg), which is a divalent metal.

The piezoelectric layer 160 includes a piezoelectric portion 162 disposed in a flat portion S, and a bent portion 164 disposed in an extension portion E.

The piezoelectric portion 162 is a portion of the piezoelectric layer 160 directly stacked on the upper surface of the lower electrode 150. Therefore, the piezoelectric portion 162 is disposed between the lower electrode 150 and the upper electrode 170, and is formed in a flat shape, as are portions of the lower electrode 150 and the upper electrode 170 disposed in the flat portion S.

The bent portion 164 is defined as a portion extending in an outward direction from the piezoelectric portion 162, and is disposed in the extension portion E.

The bent portion 164 is disposed on the insertion layer 180 to be described later, and is formed in a raised shape corresponding to a thickness and a shape of the insertion layer 180. Thus, the piezoelectric layer 160 is bent at the boundary between the piezoelectric portion 162 and the bent portion 164.

The bent portion 164 is divided into an inclined portion 164a and an extended portion 164b.

The inclined portion 164a is an inclined portion formed along an inclined surface L of the insertion layer 180 to be described later. The extended portion 164b is a portion extending in an outward direction from the inclined portion 164a.

The surface of the inclined portion 164a is formed parallel to the inclined surface L of the insertion layer 180, and an inclination angle of the surface of the inclined portion 164a is equal to an inclination angle θ of the inclined surface L of the insertion layer 180.

The upper electrode 170 is formed to cover at least a portion of the piezoelectric layer 160 disposed above the cavity C. The upper electrode 170 may be used as either an input electrode or an output electrode for inputting or outputting an electrical signal such as a radio-frequency (RF) signal. For example, when the lower electrode 150 is used as an input electrode, the upper electrode 170 may be used as an output electrode, and when the lower electrode 150 is used as an output electrode, the upper electrode 170 may be used as an input electrode.

The upper electrode 170 may be formed of a conductive material such as molybdenum (Mo), or an alloy thereof. Alternatively, the upper electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The insertion layer 180 is disposed between the lower electrode 150 and the piezoelectric layer 160. The insertion layer 180 may be formed of a dielectric, such as silicon oxide ($SiO_2$), aluminum nitride (AlN), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), or zinc oxide (ZnO), but is formed of a material different from a material of the piezoelectric layer 160. In addition, the insertion layer 180 may be removed to form a space if necessary by removing the insertion layer 180 during the manufacturing process.

In this example, a thickness of the insertion layer 180 is equal to or substantially equal to a thickness of the lower electrode 150. The insertion layer 180 may be formed to be thinner than the piezoelectric layer 160, or may be formed to have a thickness that is equal to or substantially equal to a thickness of the piezoelectric layer 160. For example, the insertion layer 180 may be formed to have a thickness of 100 Å or more, and may be formed to be thinner than the piezoelectric layer 160. However, the thickness of the insertion layer 180 is not limited to these examples.

The insertion layer 180 is disposed along a surface formed by the membrane layer 140, the lower electrode 150, and the etching prevention portion 130.

The insertion layer 180 is disposed around the flat portion S to support the bent portion 164 of the piezoelectric layer 160. Therefore, the bent portion 164 of the piezoelectric layer 160 is divided into the inclined portion 164a and the extended portion 164b depending on a shape of the insertion layer 180.

The insertion layer 180 is disposed in the extension portion E and is not disposed in the flat portion S. For example, the insertion layer 180 may be disposed in the entire extension portion E, or may be disposed in only a portion of the extension portion E, which is the case in FIG. 1.

At least a portion of the insertion layer 180 is disposed between the piezoelectric layer 160 and the lower electrode 150.

A thickness of an edge of the insertion layer 180 disposed along the boundary of the flat portion S increases as a distance from the flat portion S increases. The edge of the insertion layer 180 may be formed to have an inclined surface L so that the inclined surface L of the edge of the insertion layer 180 disposed adjacent to the flat portion S has a constant inclination angle θ.

When the inclination angle θ of the inclined surface of the edge of the insertion layer 180 is less than 5°, a thickness of the insertion layer 180 must be very thin or a width of a region occupied by the inclined surface L must be very large to be able to manufacture the insertion layer 180. However, it is difficult to manufacture the insertion layer 180 in either of these cases.

In addition, when the inclination angle θ of the inclined surface of the edge of the insertion layer 180 is greater than 70°, an inclination angle of the inclined portion 164a of the piezoelectric layer 160 stacked on the insertion layer 180 will also be greater than 70°. In this case, since the piezoelectric layer 160 is excessively bent, a crack may occur in the bent portion 164 of the piezoelectric layer 160.

The passivation layer 190 may be formed in an entire region of the bulk acoustic wave resonator 100 except where a portion of the lower electrode 150 and the upper electrode 170 are formed. The passivation layer 190 prevents damage to the upper electrode 170 and the lower electrode 150 during the manufacturing process.

The passivation layer 190 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The passivation layer 190 may be partially removed by etching to adjust an operating frequency of the bulk acoustic wave resonator 100 in a final operation of the manufacturing process. For example, the thickness of the passivation layer 190 may be adjusted in the final operation. The passivation layer 190 includes a non-trimming-processed portion 192 disposed outside an active region of the bulk acoustic wave resonator 100 in which portions of the lower electrode 150, the piezoelectric layer 160, and the upper electrode 170 overlap, and having a thickness that is thicker than a thickness of a portion of the passivation layer 190 disposed in the active region.

For example, as illustrated in FIG. 2, a non-trimming-processed region A in which a trimming operation was not performed, and a trimming-processed region B in which a trimming operation was performed, are formed in the passivation layer 190. Furthermore, a connection region C is formed between the non-trimming-processed region A and the trimming-processed region B.

In this example, a width of the connection region C, that is, a distance between the non-trimming-processed region A and the trimming-processed region B, is 1 μm or less. A width of the connection region C separating the non-trimming-processed region A, and the trimming-processed region B which a trimming operation was performed, is reduced by using a photoresist (PR) trimming mask to perform the trimming operation. The PR trimming mask is formed of a photoresist.

For example, a thickness t1 of the non-trimming-processed region A in the passivation layer 190, e.g., a thickness t1 of the non-trimming-processed portion 192, and a thickness t2 of the trimming-processed region B in the passivation layer 190 are made to be different from each other by the trimming operation. The non-trimming-processed region A and the trimming-processed region B having different thicknesses are spaced apart from each other by a distance of 1 μm or less as a result of using the PR trimming mask to perform the trimming operation.

Figure 3:
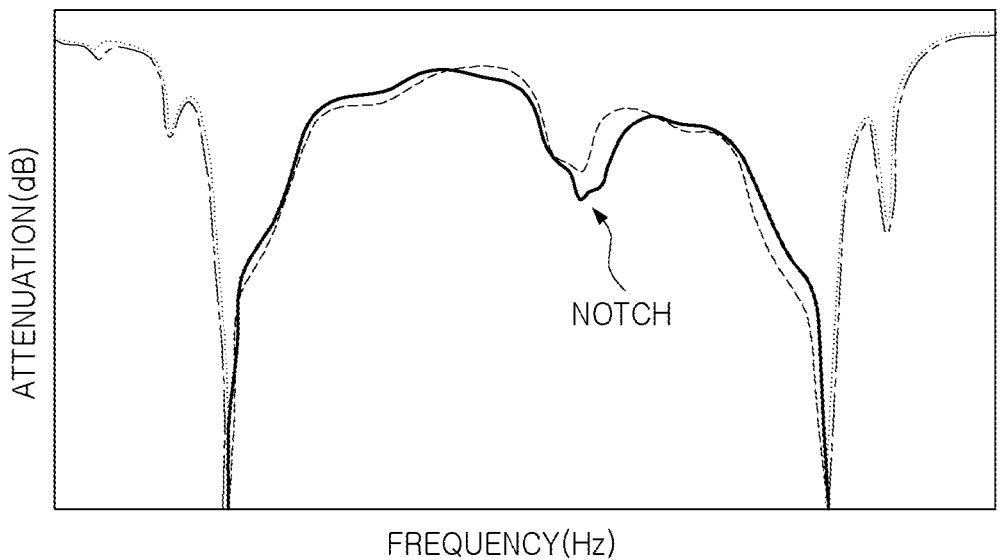
FIG. 3 is a graph illustrating a filter waveform of a filter implemented with a bulk acoustic wave resonator of the related art.
Figure 4:
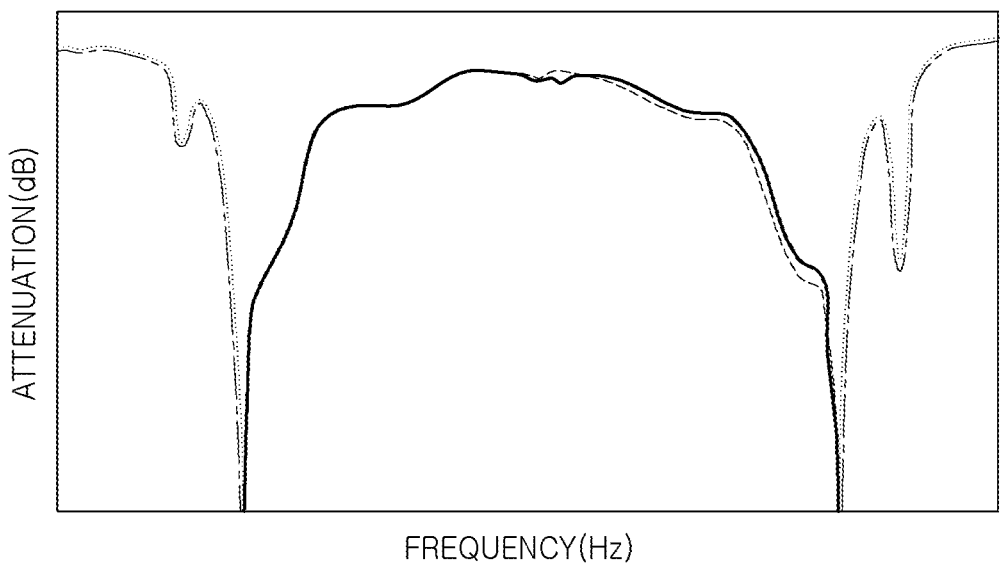
FIG. 4 is a graph illustrating a filter waveform of a filter implemented with a bulk acoustic wave resonator of this application.

FIG. 3 is a graph illustrating a filter waveform of a filter implemented with a bulk acoustic wave resonator of the related art; FIG. 4 is a graph illustrating a filter waveform of a filter implemented with a bulk acoustic wave resonator of this application; and FIG. 5 is a graph illustrating resonator waveforms of bulk acoustic wave resonators of the related art and this application.

As illustrated in FIG. 3, when a trimming operation is performed on a passivation layer of a bulk acoustic wave resonator using a stencil mask of the related art, a notch is generated in a filter waveform of a filter implemented with the trimmed bulk acoustic wave resonator of the related art because the trimming operation using the stencil mask of the related art produces an unevenly trimmed passivation layer having a nonuniform thickness in the trimmed bulk acoustic wave resonator of the related art.

In contrast, as illustrated in FIG. 4, when a trimming operation is performed on a passivation layer of a bulk acoustic wave resonator using the PR trimming mask of this application, a notch is not generated in a filter waveform of a filter implemented with the trimmed bulk acoustic resonator of this application because the trimming operation using the PR trimming mask of this application produces a substantially evenly trimmed passivation layer having a substantially uniform thickness compared to the unevenly trimmed passivation layer having a nonuniform thickness produced by the stencil mask of the related art.

Figure 5:
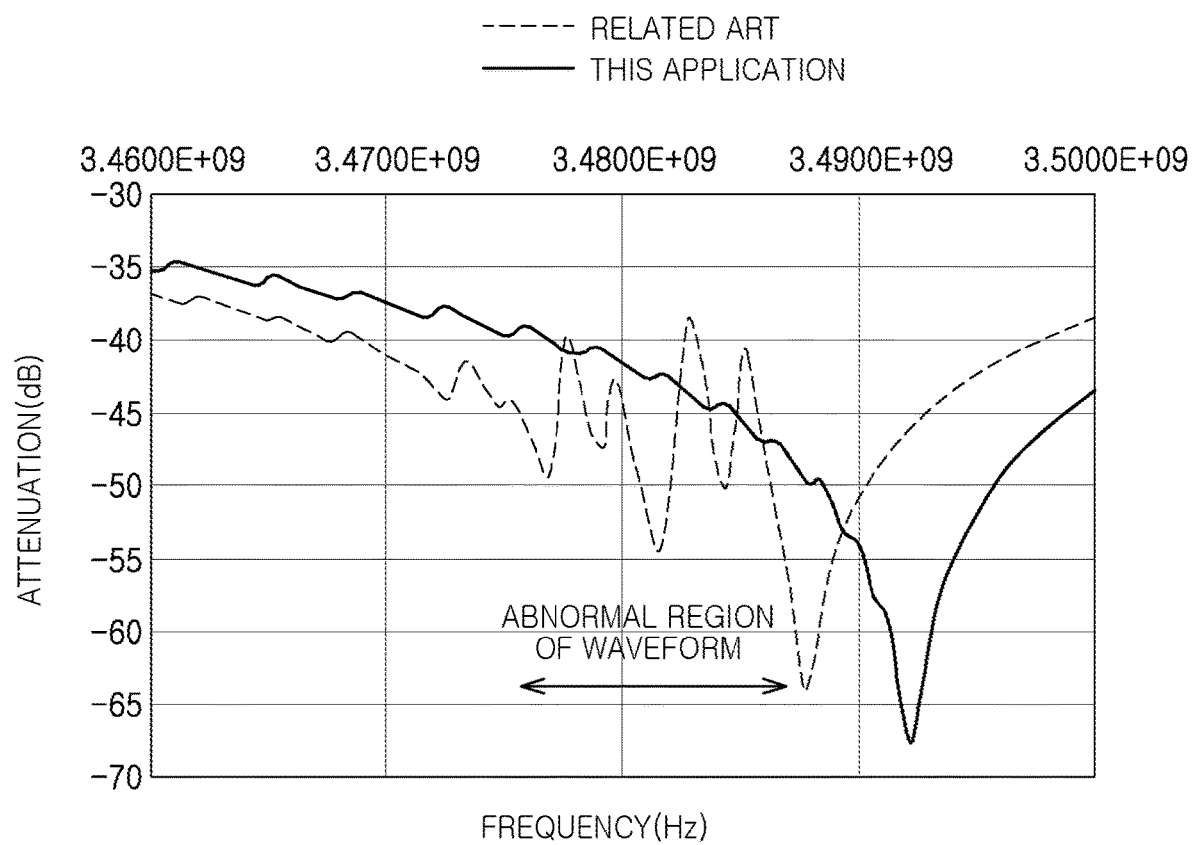
FIG. 5 is a graph illustrating resonator waveforms of bulk acoustic wave resonators of the related art and this application.

Furthermore, as illustrated in FIG. 5, when a trimming operation is performed on a passivation layer of a bulk acoustic wave resonator using the stencil mask of the related art, an abnormal region of amplitude fluctuation is generated in a resonator waveform of the trimmed bulk acoustic wave resonator of the related art because the trimming operation using the stencil mask of the related art produces an unevenly trimmed passivation layer having a nonuniform thickness in the trimmed bulk acoustic wave resonator of the related art. In contrast, when a trimming operation is performed on a passivation layer of a bulk acoustic wave resonator using the PR trimming mask of this application, an abnormal region of amplitude fluctuation is not generated in a resonator waveform of the trimmed bulk acoustic wave resonator of this application because the trimming operation using the PR trimming mask of this application produces a substantially evenly trimmed passivation layer having a substantially uniform thickness compared to the unevenly trimmed passivation layer having a nonuniform thickness produced by the stencil mask of the related art.

As described above, when a trimming operation is performed using the PR trimming mask of this application, the characteristics of the resonator are improved.

The metal pads 195 are formed on portions of the lower electrode 150 and the upper electrode 170 on which the passivation layer 190 is not formed. For example, the metal pads 195 may be formed of a material such as gold (Au), a gold-tin (Au—Sn) alloy, copper (Cu), a copper-tin (Cu—Sn) alloy, aluminum (Al), or an aluminum alloy. For example, the aluminum alloy may be an aluminum-germanium (Al—Ge) alloy.

As described above, in a portion of the passivation layer 190 disposed outside the active region in which portions of the lower electrode 150, the piezoelectric layer 160, and the upper electrode 170 overlap, a width of the connection region C, that is, a distance between the non-trimming-processed region A and the trimming-processed region B, is 1 μm or less. Thus, a thickness gradient is present over a relatively narrow region of the passivation layer 190.

Therefore, a notch in a filter waveform occurring due to the presence of a thickness gradient over a relatively wide region of the passivation layer 190 is suppressed.

Furthermore, an abnormal region of amplitude fluctuation in a resonator waveform occurring due to the presence of a thickness gradient over a relatively wide region of the passivation layer 190 is suppressed.

As described above, when a trimming operation is performed using the PR trimming mask of this application, the characteristics of the resonator are improved.

Figure 6:
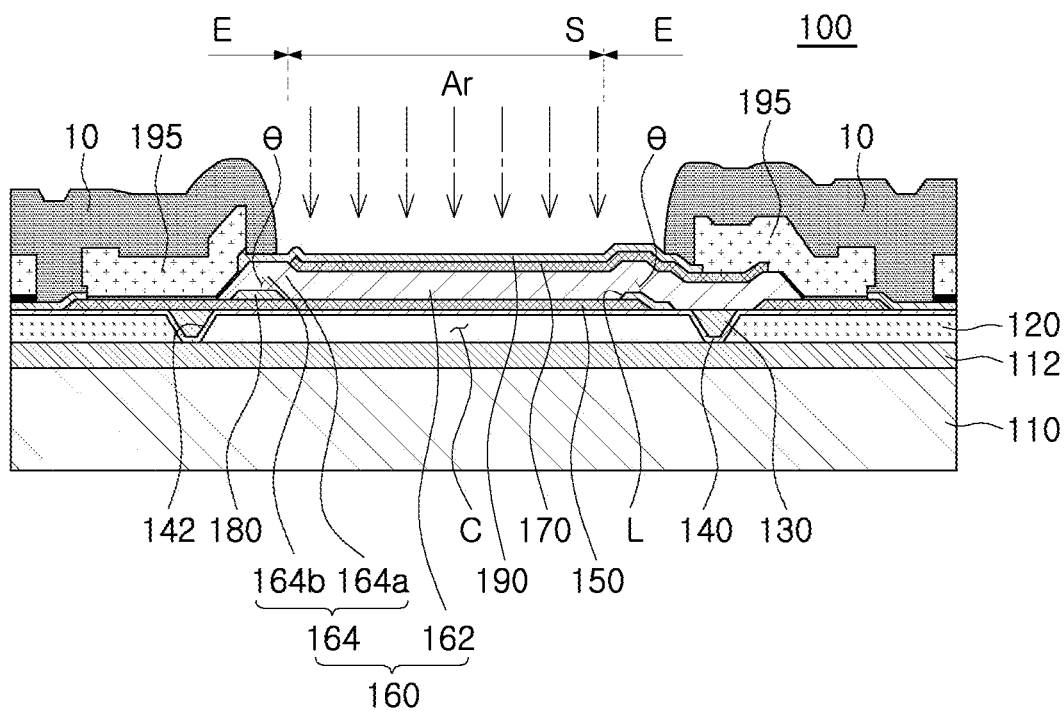
FIG. 6 is an explanatory view for explaining a trimming operation of this application in a method of manufacturing a bulk acoustic wave resonator.

FIG. 6 is an explanatory view for explaining a trimming operation of this application in a method of manufacturing a bulk acoustic wave resonator.

As illustrated in FIG. 6, a PR trimming mask 10 formed of a photoresist through a photolithography process is used as a trimming mask. For example, the PR trimming mask 10 is stacked on the passivation layer 190 after formation of the metal pads 195 in a region of the passivation layer 190 in which a trimming operation is not to be performed. Thereafter, a trimming operation is performed on the passivation layer 190 in a region of the passivation layer 190 on which the PR trimming mask 10 is not stacked. Thereafter, the PR trimming mask 10 is removed.

In the method of manufacturing a bulk acoustic wave resonator described above, advantages are obtained by using a photolithography process to form the PR trimming mask 10 of a photoresist.

First, the material cost of the PR trimming mask is about ½s the material cost of the stencil mask of the related art.

Also, by using an automated facility performing a photolithography process to form the PR trimming mask, an ease of processing is secured. In addition, since a stepper facility is used in an exposure process included in the photolithography process, an alignment accuracy between the bulk acoustic wave resonator 100 and the PR trimming mask 10 is improved, and a reproducibility of the trimming operation is secured. Therefore, a trimming operation may be performed in a state in which a reproducibility is secured at a desired precise position, as compared with the case of using the stencil mask of the related art.

In addition, since there is no gap between the bulk acoustic wave resonator 100 and the PR trimming mask 10, an ion beam shadow effect that occurs when using the stencil mask is prevented. Since the PR trimming mask 10 covers the other layers of the bulk acoustic wave resonator 100 except for the layer on which the trimming operation is to be performed, the other layers are not exposed during the trimming operation. Therefore, a distortion of an ion beam path caused by an attractive or repulsive force between the other layers and argon ions forming an ion beam used to perform the trimming operation is prevented.

Therefore, as illustrated in FIG. 2, a clear step difference is formed at a precise location in the passivation layer 190 on which the trimming operation was performed, as compared to a result obtained by the stencil of the related art.

Referring to FIG. 2 in detail, a non-trimming-processed region A in which the trimming operation was not performed, and a trimming-processed region B in which the trimming operation was performed, are formed in the passivation layer 190 on which the trimming operation was performed. Furthermore, a connection region C having a clear step difference is formed between the non-trimming-processed region A and the trimming-processed region B.

In this example, a width of the connection region C, that is, a distance between the non-trimming-processed region A and the trimming-processed region B, is 1 μm or less. For example, a width of the connection region C separating the non-trimming-processed region A, and the trimming-processed region B in which a trimming operation was performed, is greatly reduced by using a PR trimming mask formed of a photoresist to perform the trimming operation.

For example, a thickness t1 of the non-trimming-processed region A in the passivation layer 190, e.g., a thickness t1 of the non-trimming-processed portion 192, and a thickness t2 of the trimming-processed region B in the passivation layer 190 are made to be different from each other by a trimming operation. The non-trimming-processed region A and the trimming-processed region B having different thicknesses are spaced apart from each other by a distance of 1 μm or less.

Figure 7:
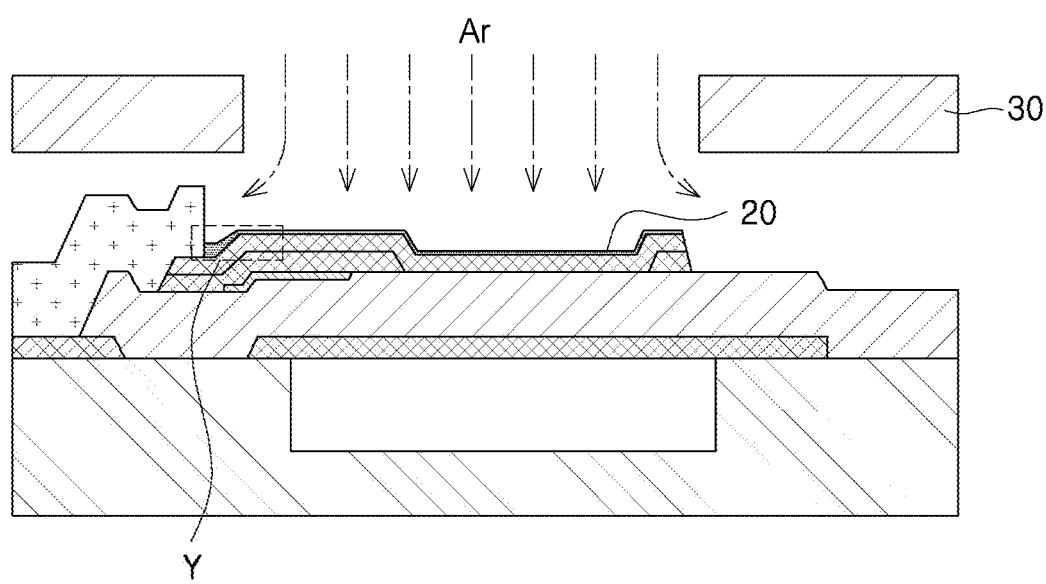
FIG. 7 is an explanatory view for explaining a trimming operation of the related art in a method of manufacturing a bulk acoustic wave resonator.
Figure 8:
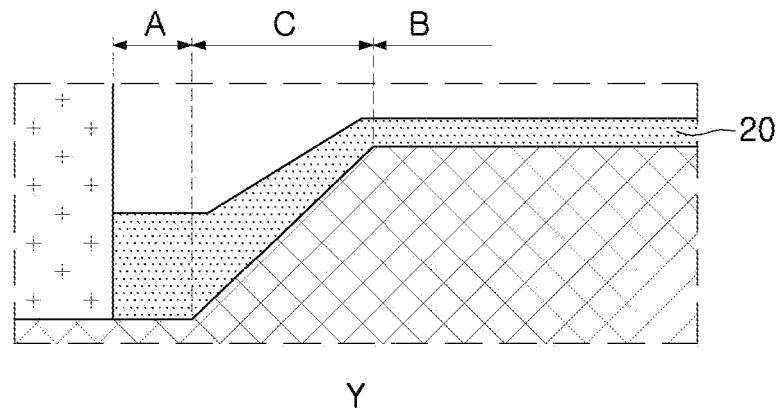
FIG. 8 is an enlarged view illustrating a portion Y in FIG. 7 after a trimming operation of the related art.

In contrast, as illustrated in FIG. 7, when a trimming operation is performed using a stencil mask 30 of the related art, a passivation layer 20 has a thickness gradient over a relatively wide region after the trimming operation as illustrated in FIG. 8. For example, a distance between a non-trimming-processed region A and a trimming-processed region B is much greater than 1 μm, and an inclined surface having a gentle inclination angle if formed in a connection region C.

As described above, by using the PR trimming mask 10 for performing the trimming operation, an alignment accuracy between the bulk acoustic wave resonator 100 and the PR trimming mask 10 is improved, and a reproducibility of the trimming operation is secured.

Therefore, a position variation error of a trimming-processed region in the passivation layer 190 on which the trimming operation was performed is reduced to 1 μm or less.

In addition, by using the PR trimming mask 10 for performing the trimming operation, an ion beam shadow effect is prevented, and a distortion of an ion beam path caused by an attractive or repulsive force between the other layers of the bulk acoustic wave resonator 100 except for the passivation layer 190 on which the trimming operation is to be performed and argon ions forming an ion beam used to perform the trimming operation is prevented.

Therefore, a non-trimming-processed portion (for example, the non-trimming processed portion 192 in FIG. 2) is formed at a specific position of a layer (for example, the passivation layer 190 in FIGS. 1 and 2) at which a straightness of argon ions is secured and a trimming operation is performed. The non-trimming-processed region A and the trimming-processed region B having different thicknesses are spaced apart from each other by a distance of 1 μm or less.

In addition, the non-trimming-processed region A and the trimming-processed region B having different thicknesses may be spaced apart from each other by a distance of 1 μm or less at specific positions of the passivation layer 190 disposed between the resonator 100 and another resonator in a bulk acoustic wave filter (not illustrated) including the resonator 100 and the other resonator. For example, even when a distance between the resonator 100 and the other resonator is 10 μm or less, a non-trimming-processed portion may be formed at a specific position of the passivation layer 190 disposed between the resonator 100 and the other resonator.

Figure 9:
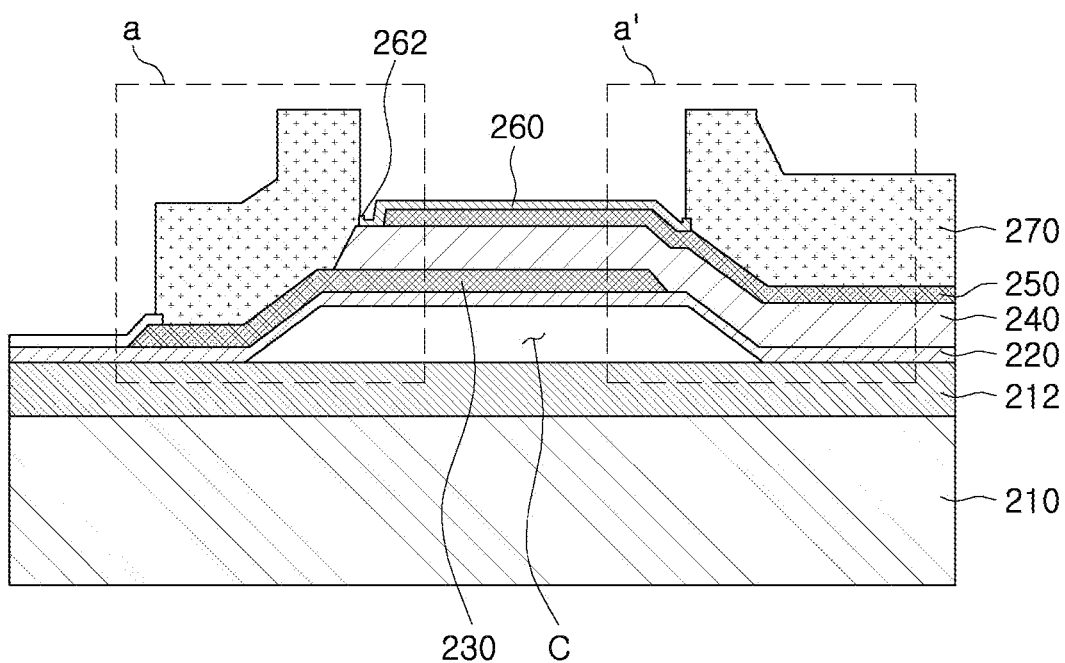
FIG. 9 is a schematic cross-sectional view illustrating another example of a bulk acoustic wave resonator.
Figure 10:
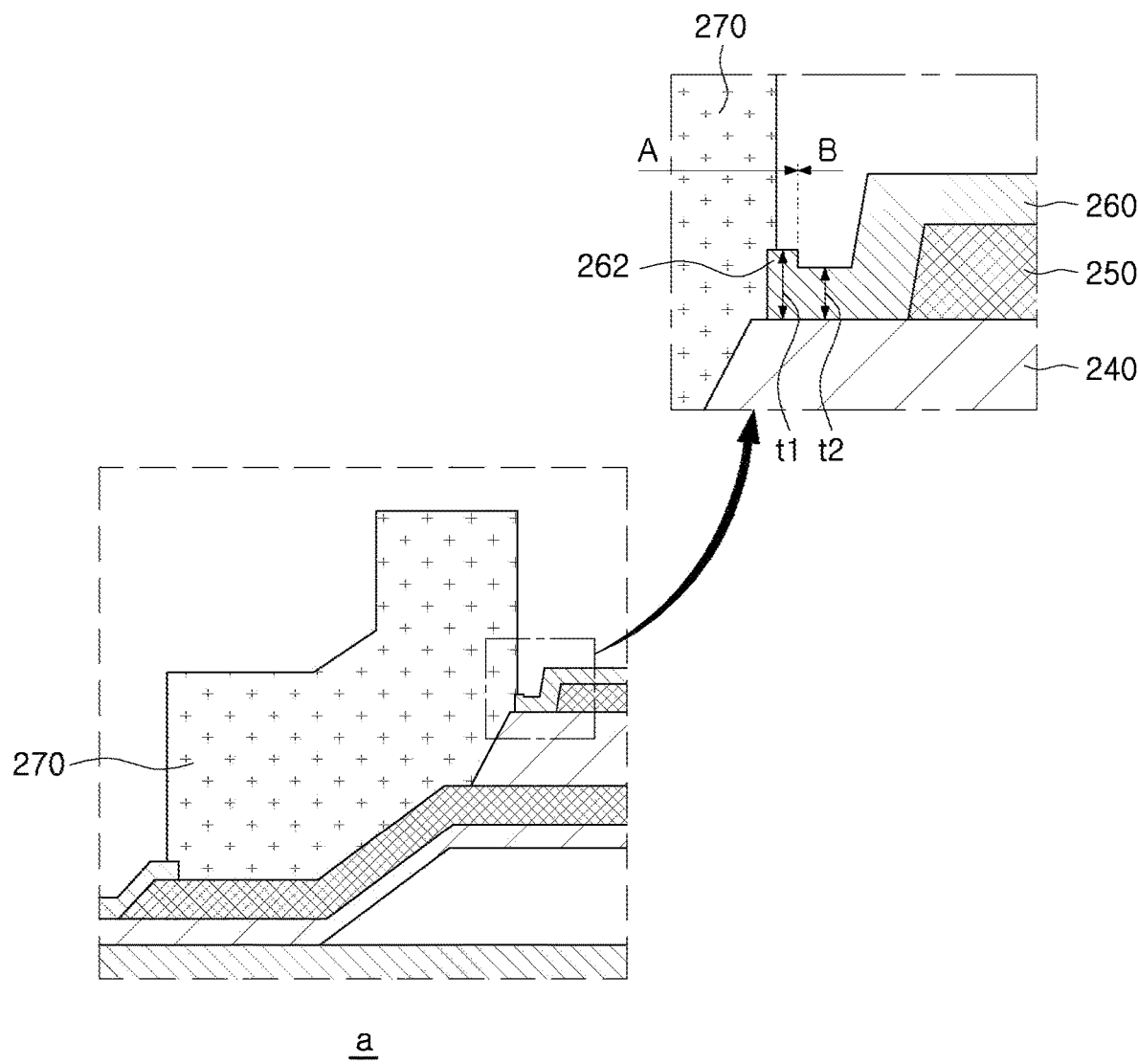
FIG. 10 is an enlarged view illustrating a portion a in FIG. 9.

FIG. 9 is a schematic cross-sectional view illustrating another example of a bulk acoustic wave resonator; FIG. 10 is an enlarged view illustrating a portion a in FIG. 9; and FIG. 11 is an enlarged view illustrating a portion a' in FIG. 9.

Figure 11:
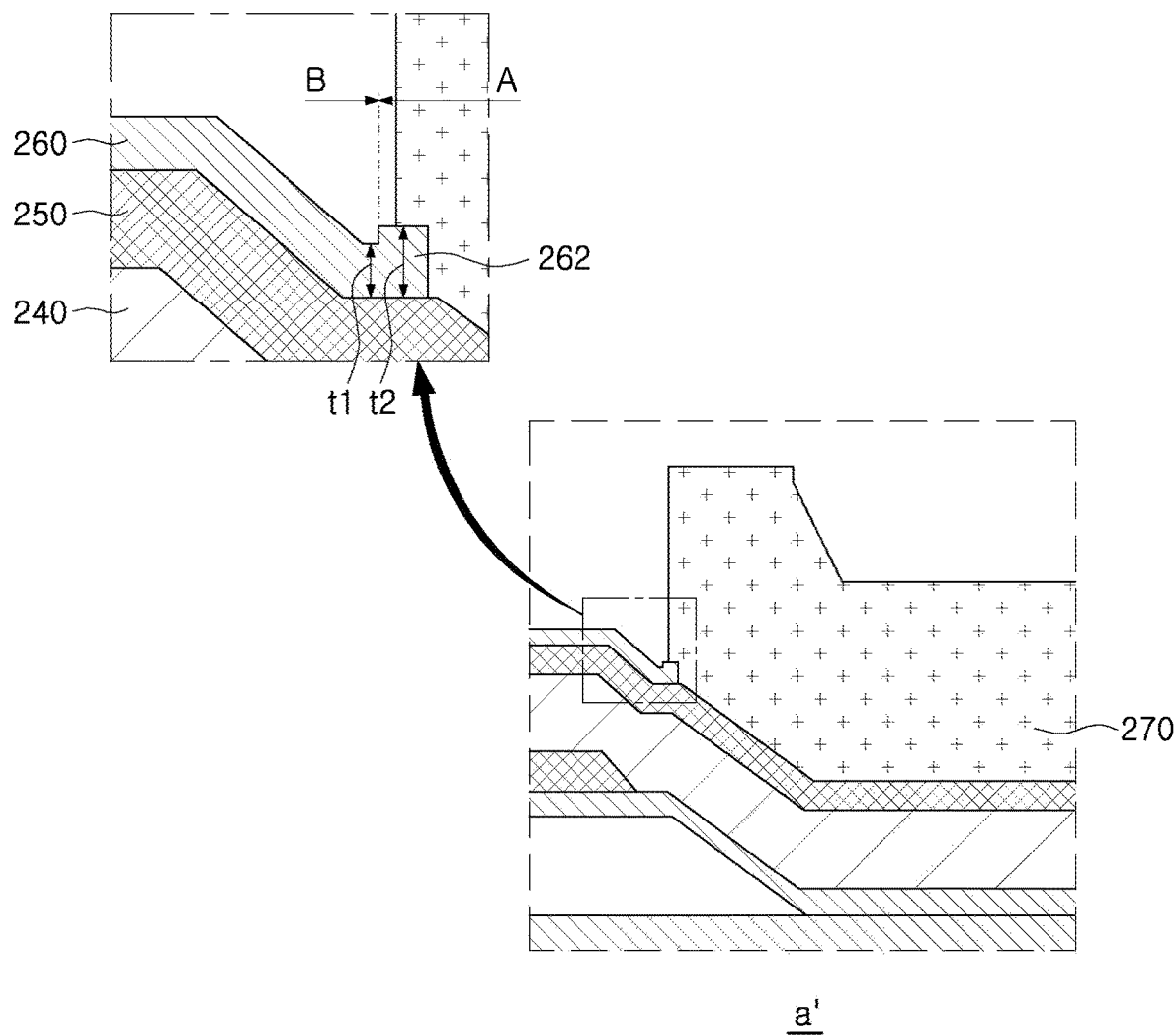
FIG. 11 is an enlarged view illustrating a portion a' in FIG. 9.

Referring to FIGS. 9 to 11, a bulk acoustic wave resonator 200 includes a substrate 210, a membrane layer 220, a lower electrode 230, a piezoelectric layer 240, an upper electrode 250, a passivation layer 260, and metal pads 270.

The substrate 210 may be a silicon substrate. For example, as the substrate 210, a silicon wafer may be used, or a silicon on insulator (SOI) type substrate may be used.

An insulation layer 212 is formed on an upper surface of the substrate 210, and electrically isolates the substrate 210 from elements formed above the substrate 210. The insulation layer 212 also prevents the substrate 210 from being etched by an etching gas used to form a cavity C during the manufacturing process.

The insulation layer 212 may be formed of any one or any combination of any two or more of silicon dioxide ($SiO_2$), silicon nitride ($Si_3N_4$), aluminum oxide ($Al_2O_3$), and aluminum nitride (AlN), and may be formed by any one or any combination of any two or more of a chemical vapor deposition process, a RF magnetron sputtering process, and an evaporation process.

The membrane layer 220 and the substrate 210 enclose the cavity C. The membrane layer 220 may be formed of a material having a low reactivity with the etching gas used to remove a portion of a sacrificial layer (not illustrated) to form the cavity C. The membrane layer 220 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not illustrated) formed of aluminum nitride (AlN) may be formed on the membrane layer 220. For example, the seed layer may be disposed between the membrane layer 220 and the lower electrode 230. The seed layer may be formed of a dielectric or a metal having an HCP crystal structure in addition to aluminum nitride (AlN). For example, when the seed layer is a metal, the seed layer may be formed of titanium (Ti).

The lower electrode 230 is formed on the membrane layer 220 so that a portion of the lower electrode layer 230 is disposed above the cavity C. The lower electrode 230 may be used as either an input electrode or an output electrode for inputting or outputting an electrical signal such as a radio-frequency (RF) signal.

The lower electrode 230 may be formed of a conductive material such as molybdenum (Mo), or an alloy thereof. Alternatively, the lower electrode 230 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The piezoelectric layer 240 is formed to cover at least a portion of the lower electrode 230 disposed above the cavity C. The piezoelectric layer 240 is formed of a material exhibiting a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 240 is formed of aluminum nitride (AlN), the piezoelectric layer 240 may further include either one or both of a rare earth metal and a transition metal. For example, the rare earth metal may be any one or any combination of any two or more of scandium (Sc), erbium (Er), yttrium (Y), and lanthanum (La), and the transition metal may be any one or any combination of any two or more of titanium (Ti), zirconium (Zr), hafnium (Hf), tantalum (Ta), and niobium (Nb). The piezoelectric layer 240 may also include magnesium (Mg), which is a divalent metal.

The upper electrode 250 is formed to cover at least a portion of the piezoelectric layer 240 disposed above the cavity C. The upper electrode 250 may be used as either an input electrode or an output electrode for inputting or outputting an electrical signal such as a radio-frequency (RF) signal. For example, when the lower electrode 230 is used as an input electrode, the upper electrode 250 may be used as an output electrode, and when the lower electrode 230 is used as an output electrode, the upper electrode 250 may be used as an input electrode.

The upper electrode 250 may be formed of a conductive material such as molybdenum (Mo), or an alloy thereof. Alternatively, the upper electrode 250 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The passivation layer 260 is formed in an entire region of the bulk acoustic wave resonator 200 except where a portion of the lower electrode 230 and a portion of the upper electrode 250 are formed. The passivation layer 260 prevents damage to the upper electrode 250 and the lower electrode 230 during the manufacturing process.

The passivation layer 260 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The passivation layer 260 may be partially removed by etching to adjust an operating frequency of the bulk acoustic wave resonator 200 in a final operation of the manufacturing process. For example, the thickness of the passivation layer 260 may be adjusted in the final operation. The passivation layer 260 includes a non-trimming-processed portion 262 disposed outside an active region of the bulk acoustic wave resonator 200 in which portions of the lower electrode 230, the piezoelectric layer 240, and the upper electrode 250 overlap, and having a thickness that is thicker than a thickness of a portion of the passivation layer 260 disposed in the active region.

For example, as illustrated in FIGS. 10 and 11, a non-trimming-processed region A in which a trimming operation was not performed, and a trimming-processed region B in which a trimming operation was performed, are formed in the passivation layer 260.

In this example, a distance between the non-trimming-processed region A and the trimming-processed region B is 1 μm or less. For example, a width of a connection region C (see FIG. 2) separating the non-trimming-processed region A, and the trimming-processed region B in which a trimming operation was performed, is greatly reduced by using a PR trimming mask formed of a photoresist to perform the trimming operation.

For example, a thickness t1 of the non-trimming-processed region A in the passivation layer 260, e.g., a thickness t1 of the non-trimming-processed portion 262, and a thickness t2 of the trimming-processed region B in the passivation layer 260 are made to be different from each other by a trimming operation. The non-trimming-processed region A and the trimming-processed region B having different thicknesses are spaced apart from each other by a distance of 1 μm or less.

Figure 12:
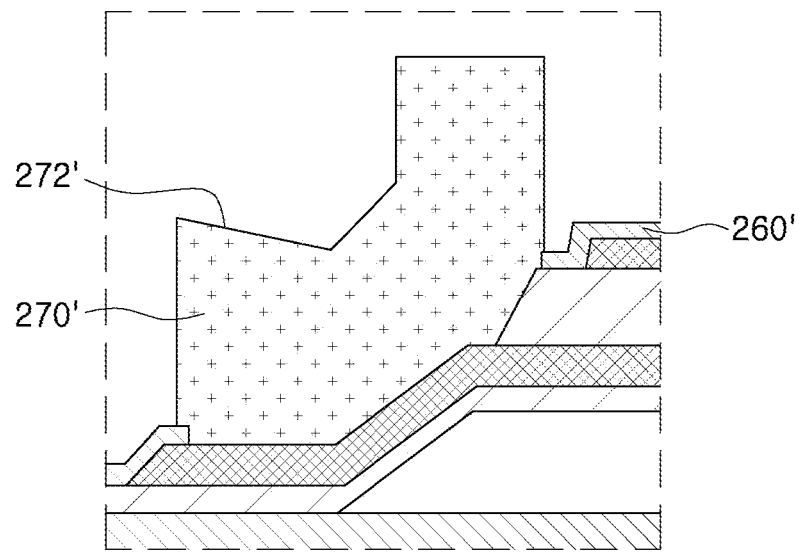
FIG. 12 is an enlarged view illustrating a region corresponding to FIG. 10 after a trimming operation of the related art.
Figure 13:
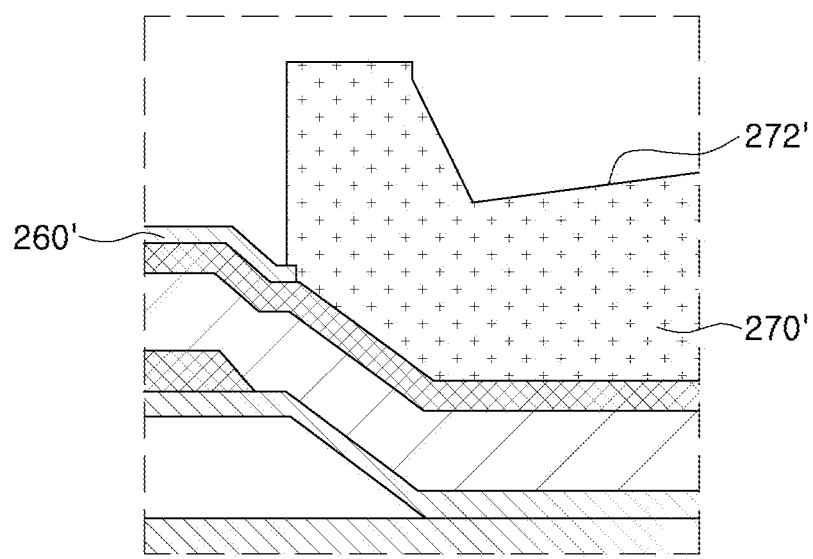
FIG. 13 is an enlarged view illustrating a region corresponding to FIG. 11 after a trimming operation of the related art.

FIG. 12 is an enlarged view illustrating a region corresponding to FIG. 10 after a trimming operation of the related art; and FIG. 13 is an enlarged view illustrating a region corresponding to FIG. 11 after a trimming operation of the related art.

As illustrated in FIGS. 12 and 13, when a trimming operation is performed using the stencil mask of the related art, metal pads 270' are inadvertently trimmed to form inclined surfaces 272'. That is, the metal pads 270' that do not require a trimming operation are nevertheless trimmed together with a passivation layer 260' to form the inclined surfaces 272'. In addition, since the trimming operation is performed on the entire upper surface of the passivation layer 260' in the region of the passivation layer 260' in which the trimming operation is performed, no step difference is formed in the passivation layer 260'.

In this example, the connection region C illustrated in FIG. 2 is not formed, so the non-trimming-processed region A and the trimming-processed region B are in contact with each other. However, this example is not limited thereto, and the connection region C may be formed between the non-trimming-processed region A and the trimming-processed region B.

The metal pads 270 are formed on portions of the lower electrode 230 and the upper electrode 250 on which the passivation layer 260 is not formed. For example, the metal pads 270 may be formed of a material such as gold (Au), a gold-tin (Au—Sn) alloy, copper (Cu), a copper-tin (Cu—Sn) alloy, aluminum (Al), or aluminum alloy. For example, the aluminum alloy may be an aluminum-germanium (Al—Ge) alloy.

As described above, in a portion of the passivation layer 260 disposed outside the active region in which portions of the lower electrode 230, the piezoelectric layer 240, and the upper electrode 250 overlap, a width of the connection region C, that is, a distance between the non-trimming-processed region A and the trimming-processed region B, is 1 μm or less. Thus, a thickness gradient is present over a relatively narrow region of the passivation layer 260.

Therefore, a notch in a filter waveform occurring due to the presence of a thickness gradient over a relatively wide region of the passivation layer 260 is suppressed.

Furthermore, an abnormal region of amplitude fluctuation in a resonator waveform due to the presence of a thickness gradient over a relatively wide region of the passivation layer 260 is suppressed.

As described above, when a trimming operation is performed using the PR trimming mask of this application, the characteristics of the resonator are improved.

Figure 14:
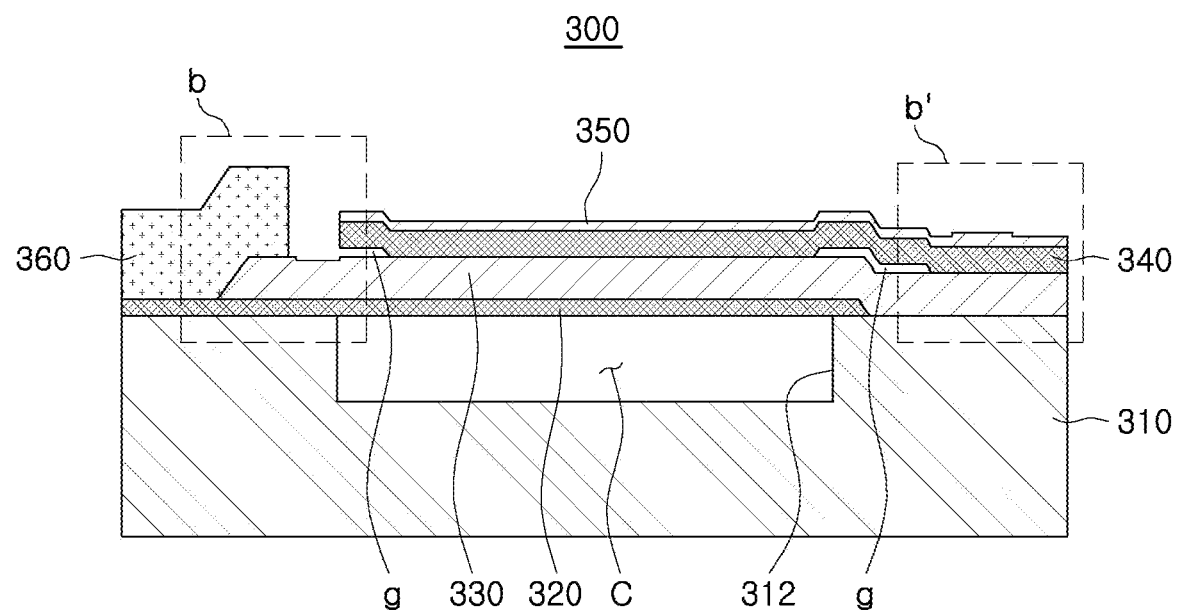
FIG. 14 is a schematic cross-sectional view illustrating another example of a bulk acoustic wave resonator.
Figure 15:
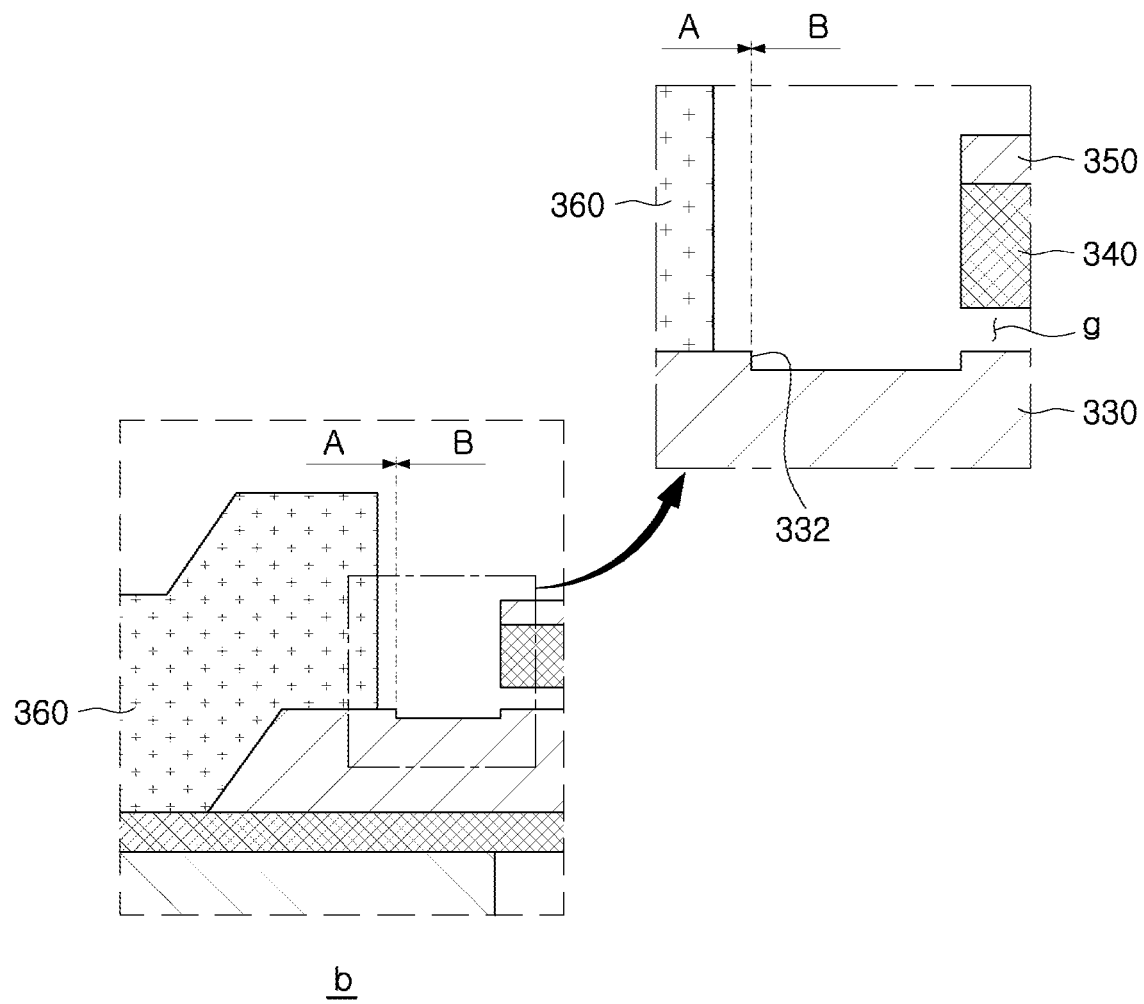
FIG. 15 is an enlarged view illustrating a portion b in FIG. 14.
Figure 16:
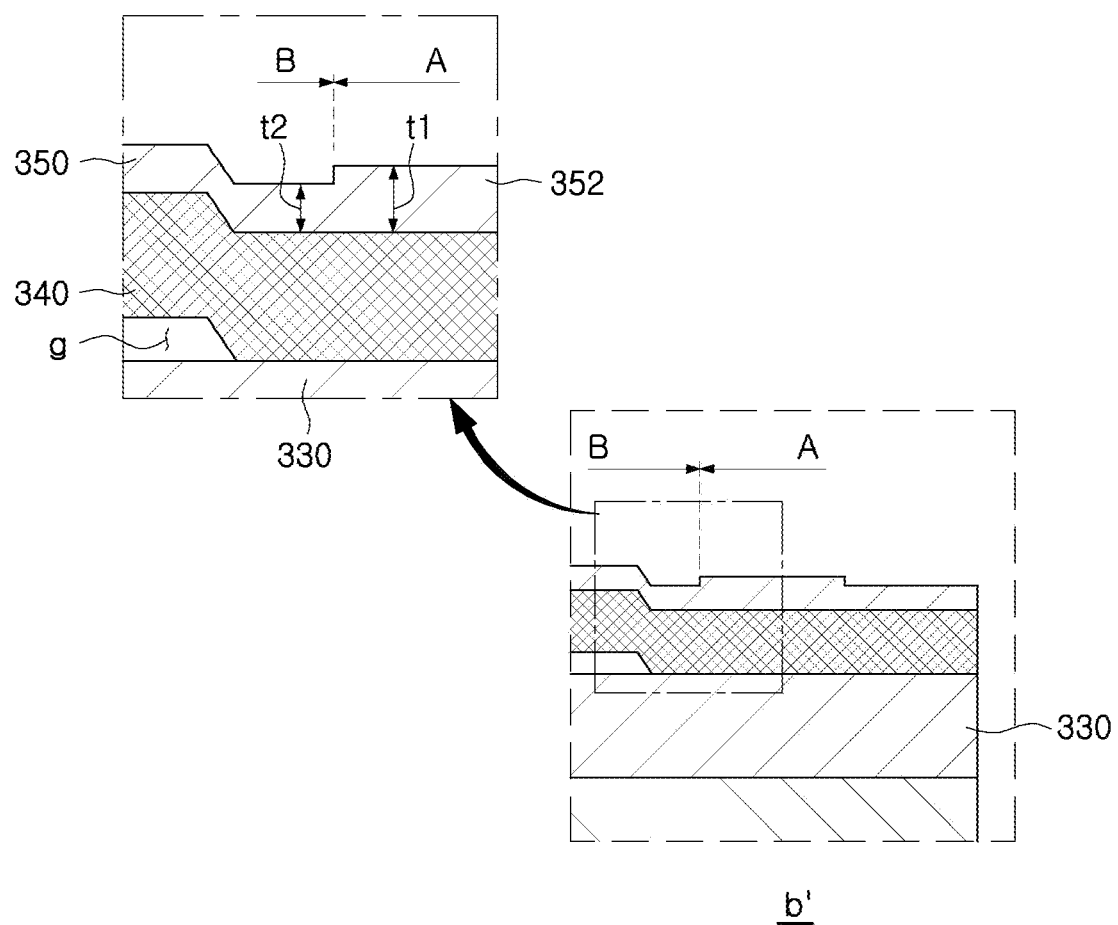
FIG. 16 is an enlarged view illustrating a portion b' in FIG. 14.

FIG. 14 is a schematic cross-sectional view illustrating another example of a bulk acoustic wave resonator; FIG. 15 is an enlarged view illustrating a portion b in FIG. 14; FIG. 16 is an enlarged view illustrating a portion b' in FIG. 14.

Referring to FIGS. 14 to 16, a bulk acoustic wave resonator 300 includes a substrate 310, a lower electrode 320, a piezoelectric layer 330, an upper electrode 340, a passivation layer 350, and a metal pad 360.

The substrate 310 may be a silicon substrate. For example, as the substrate 310, a silicon wafer may be used, or a silicon on insulator (SOI) type substrate may be used. A cavity forming groove 312 for forming a cavity C together with the lower electrode 320 is formed in the substrate 310.

The lower electrode 320 is formed to cover the cavity forming groove 312. The lower electrode 320 may be used as either an input electrode or an output electrode for inputting or outputting an electrical signal such as a radio-frequency (RF) signal.

The lower electrode 320 may be formed of a conductive material such as molybdenum (Mo), or an alloy thereof. Alternatively, the lower electrode 320 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The piezoelectric layer 330 is formed to cover at least a portion of the lower electrode 320 disposed above the cavity C. The piezoelectric layer 330 is formed of a material exhibiting a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 330 is formed of aluminum nitride (AlN), the piezoelectric layer 330 may further include either one or both of a rare earth metal and a transition metal. For example, the rare earth metal may be any one or any combination of any two or more of scandium (Sc), erbium (Er), yttrium (Y), and lanthanum (La), and the transition metal may be any one or any combination of any two or more of titanium (Ti), zirconium (Zr), hafnium (Hf), tantalum (Ta), and niobium (Nb). The piezoelectric material 330 may also include (Mg), which is a divalent metal.

As illustrated in FIG. 15, an etching groove 332 is formed in the piezoelectric layer 330. The etching groove 332 is disposed between the metal pad 360 and the upper electrode 340, and is formed in an exposed portion of the piezoelectric layer 330 disposed between the metal pad 360 and the upper electrode 340. For example, the piezoelectric layer 330 may be etched by a trimming operation performed on the passivation layer 350 to form the etching groove 332. For example, a non-trimming-processed region A in which a PR trimming mask is stacked during the trimming operation, and a trimming-processed region B in which the PR trimming mask is not stacked during the trimming operation, are formed.

The upper electrode 340 is formed to cover at least a portion of the piezoelectric layer 330 disposed above the cavity C. The upper electrode 340 may be used as either an input electrode or an output electrode for inputting or outputting an electrical signal such as a radio-frequency (RF) signal. For example, when the lower electrode 320 is used as an input electrode, the upper electrode 340 may be used as an output electrode, and when the lower electrode 320 is used as an output electrode, the upper electrode 340 may be used as an input electrode.

The upper electrode 340 may be formed of a conductive material such as molybdenum (Mo), or an alloy thereof. Alternatively, the upper electrode 340 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

Gaps g are formed between the upper electrode 340 and the piezoelectric layer 330. The gaps g are disposed on opposite sides of an active region of the bulk acoustic wave resonator 300 in which portions of the lower electrode 320, the piezoelectric layer 330, and the upper electrode 340 overlap. The gaps g have shapes corresponding to a shape of the piezoelectric layer 330. For example, the gap g disposed on the right side of the active region in FIG. 14 has a bent shape, while the gap g disposed on the left side of the active region in FIG. 14 has an open shape.

The passivation layer 350 is formed to cover the upper electrode 340. The passivation layer 350 prevents damage to the upper electrode 340 during the manufacturing process.

The passivation layer 350 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The passivation layer 350 may be partially removed by etching to adjust an operating frequency of the bulk acoustic wave resonator 300 in a final operation of the manufacturing process. For example, the thickness of the passivation layer 350 may be adjusted in the final operation. The passivation layer 350 includes a non-trimming-processed portion 352 disposed outside the active region in which portions of the lower electrode 320, the piezoelectric layer 330, and the upper electrode 340 overlap, and having a thickness that is thicker than a thickness of a portion of the passivation layer 350 disposed in the active region.

For example, as illustrated in FIG. 16, a non-trimming-processed region A in which a trimming operation was not performed, and a trimming-processed region B in which a trimming operation was performed, are formed in the passivation layer 350.

In this example, a distance between the non-trimming-processed region A and the trimming-processed region B is 1 μm or less. For example, a width of a connection region C (see FIG. 2) separating the non-trimming-processed region A, and the trimming-processed region B in which a trimming operation was performed, is reduced by using a PR trimming mask formed of a photoresist to perform the trimming operation.

For example, a thickness t1 of the non-trimming-processed region A in the passivation layer 350, e.g., a thickness t1 of the non-trimming-processed portion 352, and a thickness t2 of the trimming-processed region B in the passivation layer 350 are made to be different from each other by a trimming operation. The non-trimming-processed region A and the trimming-processed region B having different thicknesses are spaced apart from each other by a distance of 1 μm or less.

Figure 17:
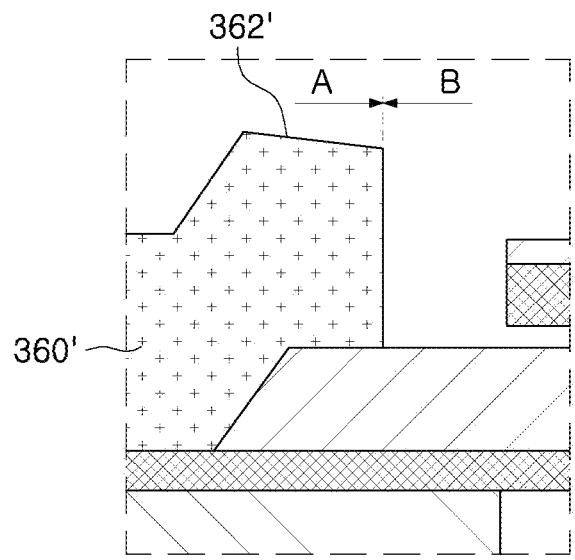
FIG. 17 is an enlarged view illustrating a region corresponding to FIG. 15 after a trimming operation of the related art.
Figure 18:
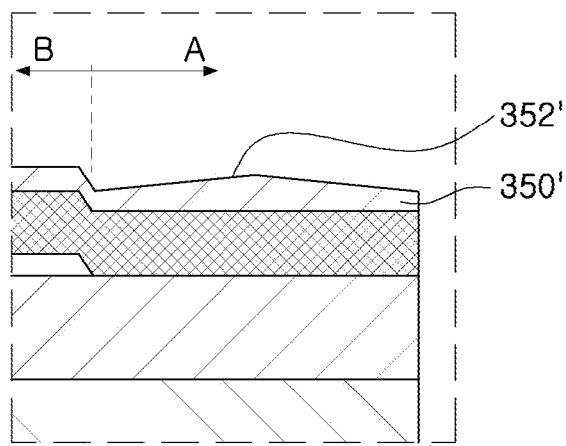
FIG. 18 is an enlarged view illustrating a region corresponding to FIG. 16 after a trimming operation of the related art.

FIG. 17 is an enlarged view illustrating a region corresponding to FIG. 15 after a trimming operation of the related art; and FIG. 18 is an enlarged view illustrating a region corresponding to FIG. 16 after a trimming operation of the related art.

As illustrated in FIGS. 17 and 18, when a trimming operation is performed using the stencil mask of the related art, a metal pad 360' and a portion of a passivation layer 350' that disposed in non-trimming-processed regions A are inadvertently trimmed to form inclined surfaces 362' and 352', respectively. That is, the metal pad 360' and the portion of the passivation layer 350' that are disposed in the non-trimming-processed regions A and therefore do not require a trimming operation are nevertheless trimmed together with a portion of the passivation layer 350' in a trimming-processed region B o form the inclined surfaces 362' and 352' that do not have a step difference between the metal pad 360' and the portion of the passivation layer 350' disposed in the non-trimming-processed regions A.

In this example, the connection region C illustrated in FIG. 2 is not formed, so the non-trimming-processed region A and the trimming-processed region B are in contact with each other. However, this example is not limited thereto, and the connection region C may be formed between the non-trimming-processed region A and the trimming-processed region B.

The metal pad 360 is formed on a portion of the lower electrode 320 on which the passivation layer 350 is not formed. For example, the metal pad 360 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

Figure 19:
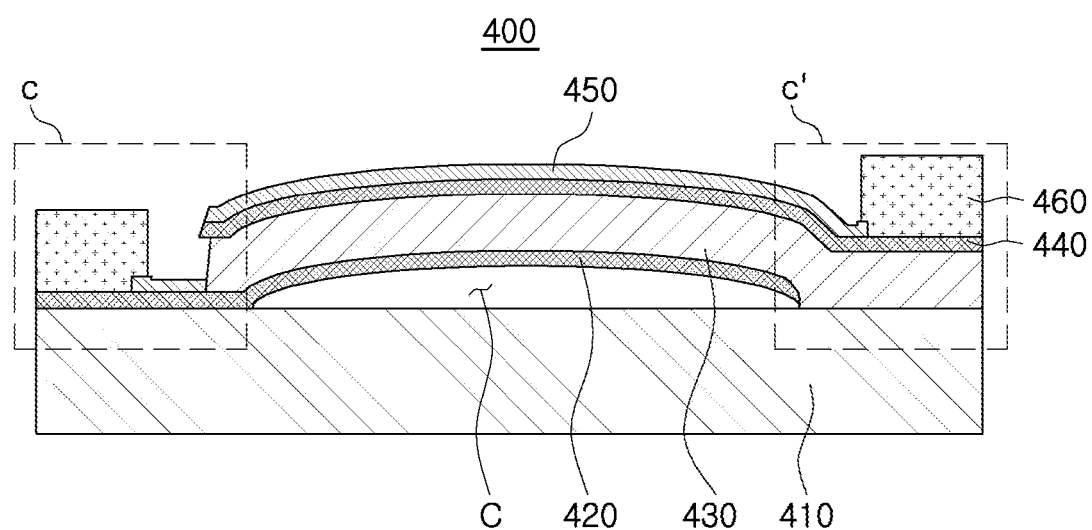
FIG. 19 is a schematic cross-sectional view illustrating another example of a bulk acoustic wave resonator.
Figure 20:
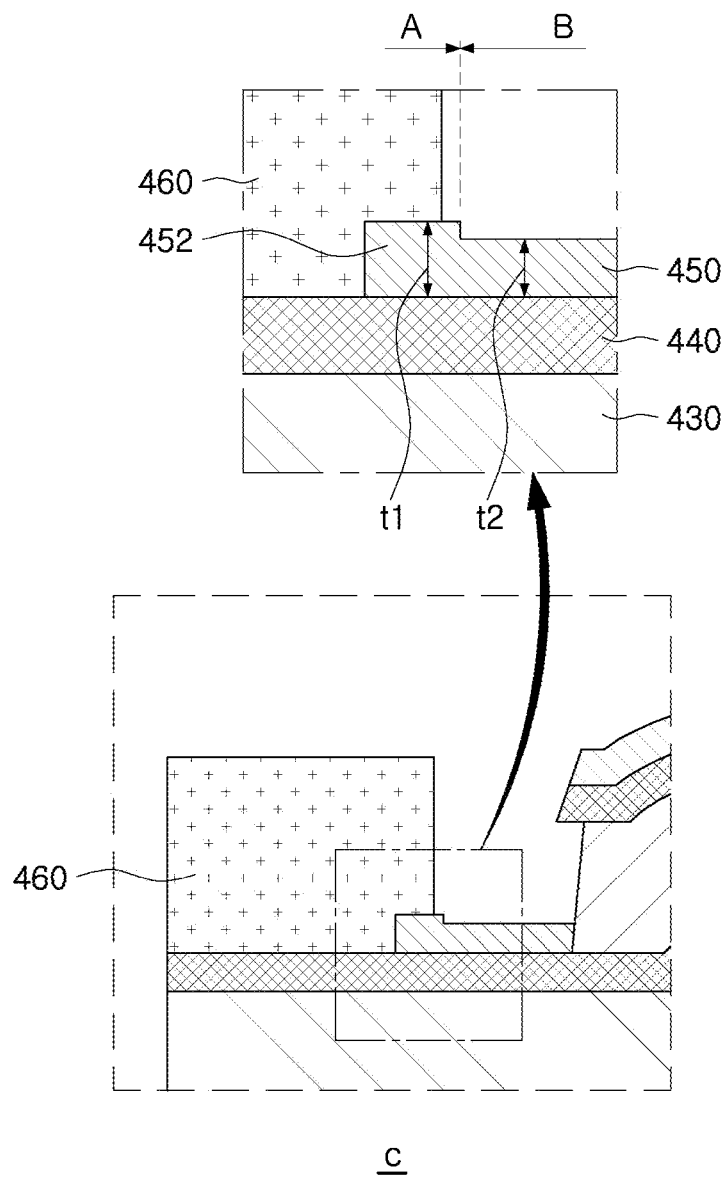
FIG. 20 is an enlarged view illustrating a portion c in FIG. 19.

FIG. 19 is a schematic cross-sectional view illustrating another example of a bulk acoustic wave resonator; FIG. 20 is an enlarged view illustrating a portion c in FIG. 19; and FIG. 21 is an enlarged view illustrating a portion c' in FIG. 19.

Figure 21:
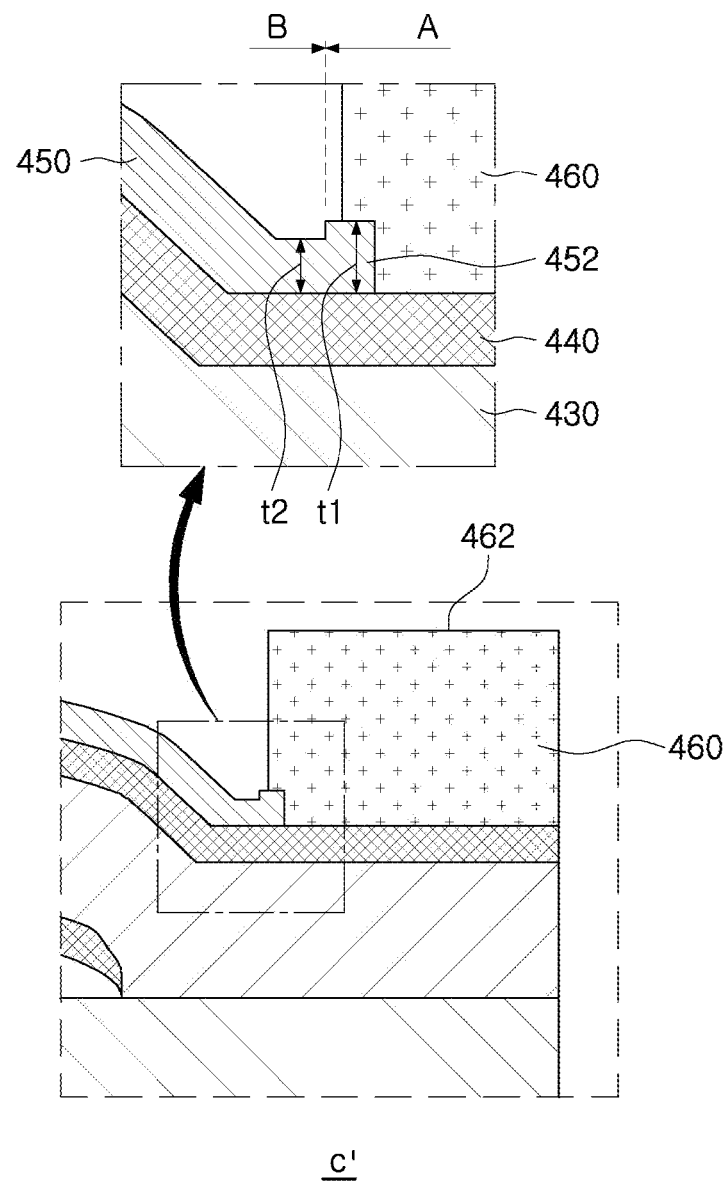
FIG. 21 is an enlarged view illustrating a portion c' in FIG. 19.

Referring to FIGS. 19 to 21, a bulk acoustic wave resonator 400 includes a substrate 410, a lower electrode 420, a piezoelectric layer 430, an upper electrode 440, a passivation layer 450, and metal pads 460.

The substrate 410 may be a silicon substrate. For example, as the substrate 410, a silicon wafer may be used, or a silicon on insulator (SOI) type substrate may be used.

An insulation layer (not illustrated) is formed on an upper surface of the substrate 410, and electrically isolates the substrate 410 from elements formed above the substrate 410. The insulation layer also prevents the substrate 410 from being etched by an etching gas used to form a cavity C during the manufacturing process.

The insulation layer may be formed of any one or any combination of any two or more of silicon dioxide ($SiO_2$), silicon nitride ($Si_3N_4$), aluminum oxide ($Al_2O_3$), and aluminum nitride (AlN), and may be formed by any one of or any combination of any two or more of a chemical vapor deposition process, a RF magnetron sputtering process, and an evaporation process.

The lower electrode 420 and the substrate 410 enclose the cavity C. To this end, a portion of the lower electrode 420 is bent to form the cavity C. The lower electrode 420 may be used as either an input electrode or an output electrode for inputting or outputting an electrical signal such as a radio-frequency (RF) signal.

The lower electrode 420 may be formed of a conductive material such as molybdenum (Mo), or an alloy thereof. Alternatively, the lower electrode 420 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The piezoelectric layer 430 is formed to cover at least a portion of the lower electrode 420 disposed above the cavity C. The piezoelectric layer 430 is formed of a material exhibiting a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 430 is formed of aluminum nitride (AlN), the piezoelectric layer 430 may further include either one or both of a rare earth metal and a transition metal. For example, the rare earth metal may be any one or any combination of any two or more of scandium (Sc), erbium (Er), yttrium (Y), and lanthanum (La), and the transition metal may be any one or any combination of any two or more of titanium (Ti), zirconium (Zr), hafnium (Hf), tantalum (Ta), and niobium (Nb). The piezoelectric layer 430 may also include magnesium (Mg), which is a divalent metal.

The upper electrode 440 is formed to cover at least a portion of the piezoelectric layer 430 disposed above the cavity C. The upper electrode 440 may be used as either an input electrode and an output electrode for inputting or outputting an electrical signal such as a radio-frequency (RF) signal. For example, when the lower electrode 420 is used as an input electrode, the upper electrode 440 may be used as an output electrode, and when the lower electrode 420 is used as an output electrode, the upper electrode 440 may be used as an input electrode.

The upper electrode 440 may be formed of a conductive material such as molybdenum (Mo), or an alloy thereof. Alternatively, the upper electrode 440 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The passivation layer 450 is formed in an entire region of the bulk acoustic wave resonator 400 except where a portion of the lower electrode 420 and a portion of the upper electrode 440 are formed. The passivation layer 450 prevents damage to the upper electrode 440 and the lower electrode 420 during the manufacturing process.

The passivation layer 450 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The passivation layer 450 may be partially removed by etching to adjust an operating frequency of the bulk acoustic wave resonator 450 in a final operation of the manufacturing process. For example, the thickness of the passivation layer 450 may be adjusted in the final operation. The passivation layer 450 includes a non-trimming-processed portion 452 disposed outside an active region of the bulk acoustic wave resonator 400 in which portions of the lower electrode 420, the piezoelectric layer 430, and the upper electrode 440 overlap, and having a thickness that is thicker than a thickness of a portion of the passivation layer 450 disposed in the active region.

For example, as illustrated in FIGS. 20 and 21, a non-trimming-processed region A in which a trimming operation was not performed, and a trimming-processed region B in which a trimming operation was performed, are formed in the passivation layer 450.

In this example, a distance between the non-trimming-processed region A and the trimming-processed region B is 1 μm or less. For example, a width of the connection region C (see FIG. 2) separating the non-trimming-processed region A, and the trimming-processed region B in which a trimming operation was performed, is greatly reduced by using a PR trimming mask formed of a photoresist to perform the trimming operation.

For example, a thickness t1 of the non-trimming-processed region A in the passivation layer 450, e.g., a thickness t1 of the non-trimming-processed portion 452, and a thickness t2 of the trimming-processed region B in the passivation layer 450 are made to be different from each other by a trimming operation. The non-trimming-processed region A and the trimming-processed region B having different thicknesses are spaced apart from each other by a distance of 1 μm or less.

Figure 22:
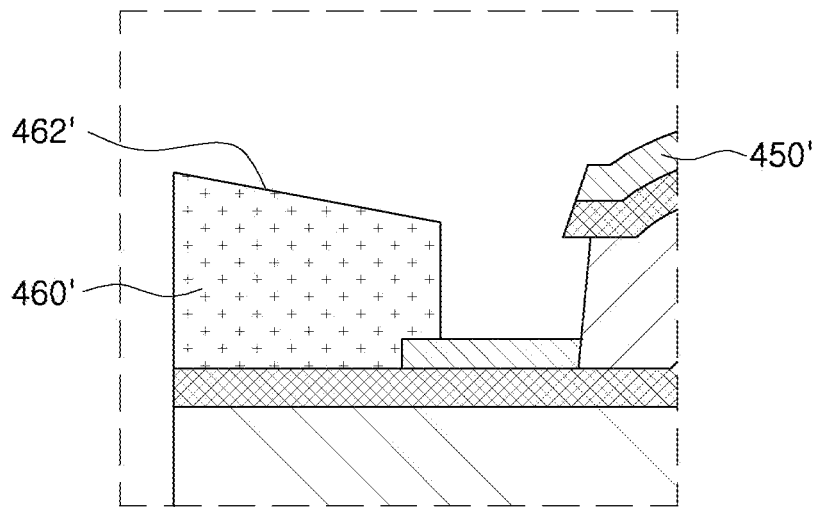
FIG. 22 is an enlarged view illustrating a region corresponding to FIG. 20 after a trimming operation of the related art.
Figure 23:
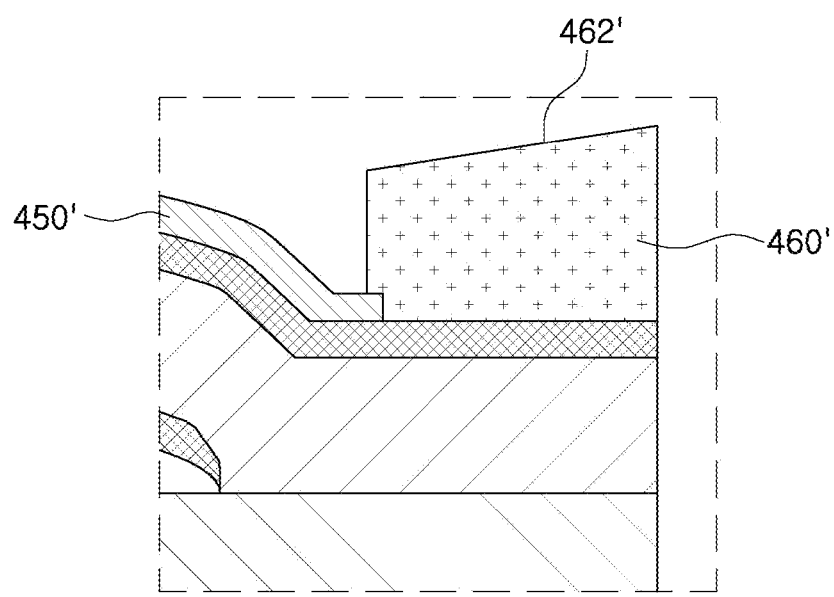
FIG. 23 is an enlarged view illustrating a region corresponding to FIG. 21 after a trimming operation of the related art.

FIG. 22 is an enlarged view illustrating a region corresponding to FIG. 20 after a trimming operation of the related art; and FIG. 23 is an enlarged view illustrating a region corresponding to FIG. 21 after a trimming operation of the related art.

As illustrated in FIGS. 22 and 23, when a trimming operation is performed using the stencil mask of the related art, metal pads 460' are inadvertently trimmed to form inclined surfaces 462'. That is, the metal pads 460' that do not require a trimming operation are nevertheless trimmed together with a passivation layer 450' to form the inclined surfaces 462'. In addition, since the trimming operation is performed on the entire upper surface region of the passivation layer 450' in the region of the passivation layer 450' in which the trimming operation is performed, no step difference is formed in the passivation layer 450'.

In this example, the connection region C illustrated in FIG. 2 is not formed, so the non-trimming-processed region A and the trimming-processed region B are in contact with each other, However, this example is not limited thereto, and the connection region C may be formed between the non-trimming-processed region A and the trimming-processed region B.

The metal pads 460 are formed on portions of the lower electrode 420 and the upper electrode 440 on which the passivation layer 450 is not formed. For example, the metal pads 460 may be formed of a material such as gold (Au), a gold-tin (Au—Sn) alloy, copper (Cu), a copper-tin (Cu—Sn) alloy, aluminum (Al), or an aluminum alloy. For example, the aluminum alloy may be an aluminum-germanium (Al—Ge) alloy.

Figure 24:
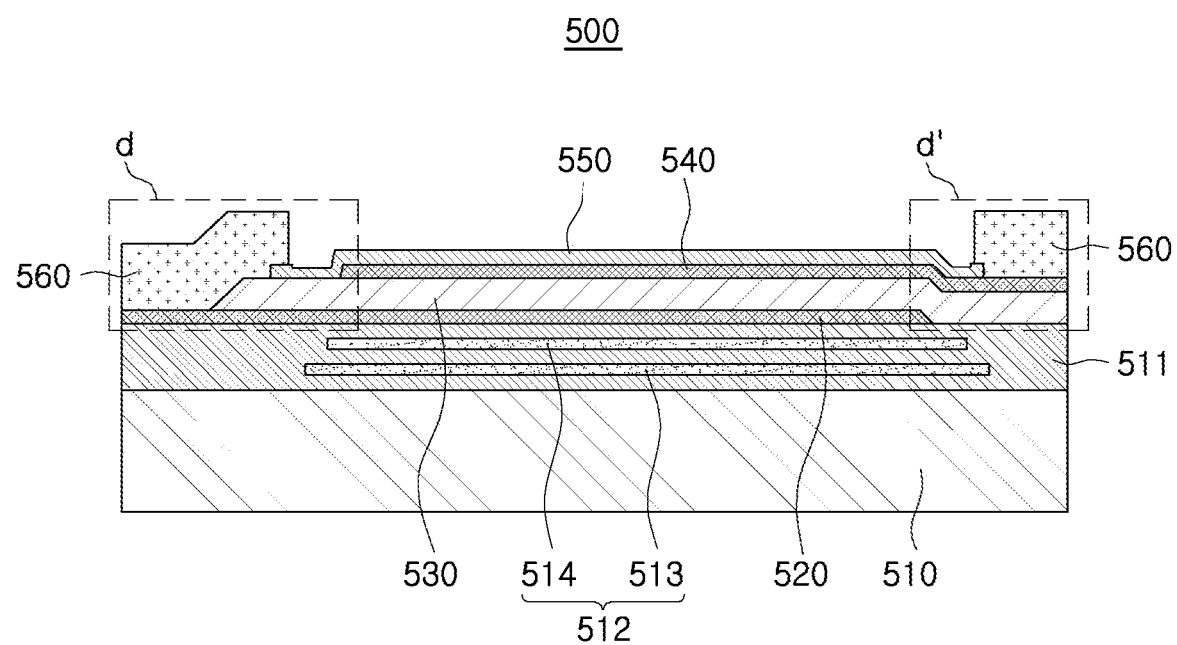
FIG. 24 is a schematic cross-sectional view illustrating another example of a bulk acoustic wave resonator.
Figure 25:
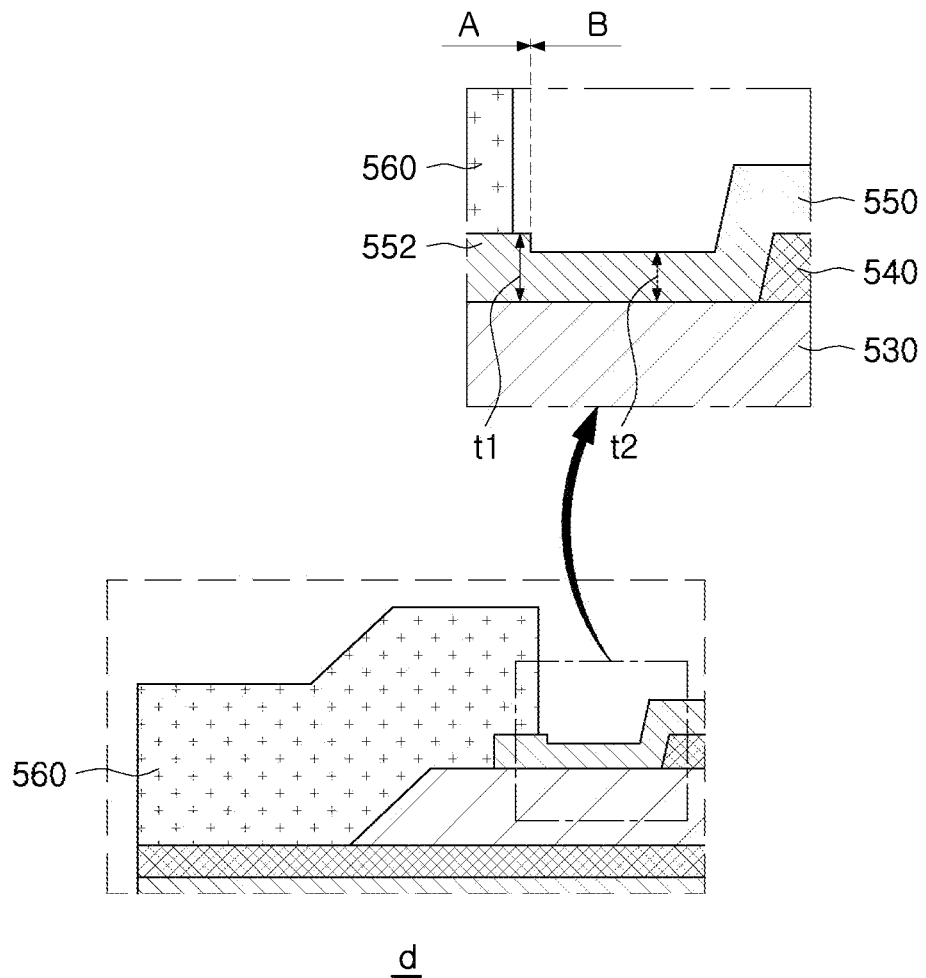
FIG. 25 is an enlarged view illustrating a portion d in FIG. 24.

FIG. 24 is a schematic cross-sectional view illustrating another example of a bulk acoustic wave resonator; FIG. 25 is an enlarged view illustrating a portion d in FIG. 24; and FIG. 26 is an enlarged view illustrating a portion d' in FIG. 24.

Figure 26:
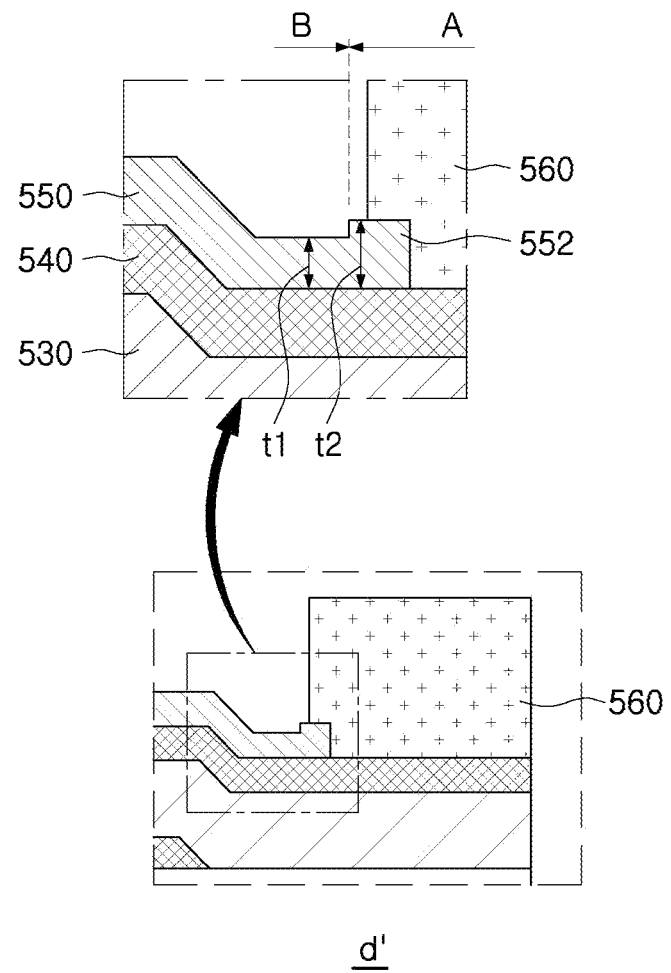
FIG. 26 is an enlarged view illustrating a portion d' in FIG. 24.

Referring to FIGS. 24 to 26, a bulk acoustic wave resonator 500 includes a substrate 510, a lower electrode 520, a piezoelectric layer 530, an upper electrode 540, a passivation layer 550, and metal pads 560.

The substrate 510 may be a silicon substrate. For example, as the substrate 510, a silicon wafer may be used, or a silicon on insulator (SOI) type substrate may be used. The substrate 510 includes a dielectric layer 511, and a reflection layer 512 disposed in the dielectric layer 511. However, in another example, the reflection layer may be disposed on the substrate 510 or in a groove formed in the substrate 510.

The reflection layer 512 is disposed in a central portion of the substrate 510 below an active region of the bulk acoustic wave resonator 500 in which portions of the first electrode 520, the piezoelectric layer 530, and the upper electrode 540 overlap.

The reflection layer 512 includes a first reflection member 513 and a second reflection member 514 formed of different materials.

The first reflection member 513 may be formed of a conductive material such as molybdenum (Mo), or an alloy thereof. Alternatively, the first reflection member 513 may be formed of ruthenium (Ru), tungsten (W), iridium (Ir), platinum (Pt), copper (Cu), titanium (Ti), tantalum (Ta), nickel (Ni), or chromium (Cr). The second reflection member 514 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO). Only one pair of the first reflection member 513 and the second reflection member 514 may be formed as illustrated in FIG. 24, or a plurality of pairs of the first reflection member 513 and the second reflection member 514 may be formed.

A seed layer (not illustrated) formed of aluminum nitride (AlN) may be formed on the dielectric layer 511. For example, the seed layer may be disposed between the dielectric layer 511 and the lower electrode 520. The seed layer may be formed of a dielectric or a metal having an HCP crystal structure in addition to aluminum nitride (AlN). For example, when the seed layer is a metal, the seed layer may be formed of titanium (Ti).

The lower electrode 520 is formed on the dielectric layer 511. The lower electrode 520 may be used as either an input electrode or an output electrode for inputting or outputting an electrical signal such as a radio-frequency (RF) signal.

The lower electrode 520 may be formed of a conductive material such as molybdenum (Mo), or an alloy thereof. Alternatively, the lower electrode 520 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The piezoelectric layer 530 is formed to cover at least a portion of the lower electrode 520 disposed above the reflection layer 512. The piezoelectric layer 530 is formed of a material exhibiting a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 530 is formed of aluminum nitride (AlN), the piezoelectric layer 530 may further include either one or both of a rare earth metal and a transition metal. For example, the rare earth metal may be any one or any combination of any two or more of scandium (Sc), erbium (Er), yttrium (Y), and lanthanum (La), and the transition metal may be any one or any combination of any two or more of titanium (Ti), zirconium (Zr), hafnium (Hf), tantalum (Ta), and niobium (Nb). The piezoelectric layer 530 may also include magnesium (Mg), which is a divalent metal.

The upper electrode 540 is formed to cover at least a portion of the piezoelectric layer 530 disposed above the reflection layer 512. The upper electrode 540 may be used as either an input electrode or an output electrode for inputting or outputting an electrical signal such as a radio-frequency (RF) signal. For example, when the lower electrode 520 is used as an input electrode, the upper electrode 540 may be used as an output electrode, and when the lower electrode 520 is used as an output electrode, the upper electrode 540 may be used as an input electrode.

The upper electrode 540 may be formed of a conductive material such as molybdenum (Mo), or an alloy thereof. Alternatively, the upper electrode 540 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy thereof.

The passivation layer 550 is formed in an entire region of the bulk acoustic wave resonator 500 except where a portion of the lower electrode 520 and a portion of the upper electrode 540 are formed. The passivation layer 550 prevents damage to the upper electrode 540 and the lower electrode 520 during the manufacturing process.

The passivation layer 550 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The passivation layer 550 may be partially removed by etching to adjust an operating frequency of the bulk acoustic wave resonator 500 in a final operation of the manufacturing process. For example, the thickness of the passivation layer 550 may be adjusted in the final operation. The passivation layer 550 includes a non-trimming-processed portion 552 disposed outside the active region in which portions of the lower electrode 520, the piezoelectric layer 530, and the upper electrode 540 overlap, and having a thickness that is thicker than a thickness of a portion of the passivation layer 550 disposed in the active region.

For example, as illustrated in FIGS. 25 and 26, a non-trimming-processed region A in which a trimming operation was not performed, and a trimming-processed region B in which a trimming operation was performed, are formed in the passivation layer 550.

In this example, a distance between the non-trimming-processed region A and the trimming-processed region B is 1 μm or less. For example, a width of the connection region C (see FIG. 2) separating the non-trimming-processed region A, and the trimming-processed region B in which the trimming operation was performed, is greatly reduced by using a PR trimming mask formed of a photoresist to perform the trimming operation.

For example, a thickness t1 of the non-trimming-processed region A in the passivation layer 550, e.g., a thickness t1 of the non-trimming-processed portion 552, and a thickness t2 of the trimming-processed region B in the passivation layer 550 are made to be different from each other by a trimming operation. The non-trimming-processed region A and the trimming-processed region B having different thicknesses are spaced apart from each other by a distance of 1 μm or less.

Figure 27:
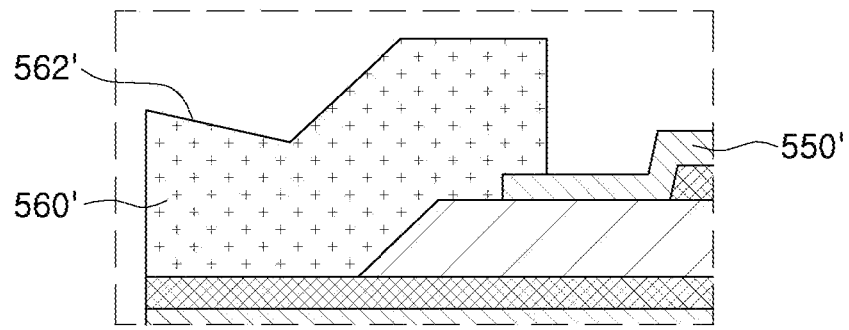
FIG. 27 is an enlarged view illustrating a region corresponding to FIG. 25 after a trimming operation of the related art.
Figure 28:
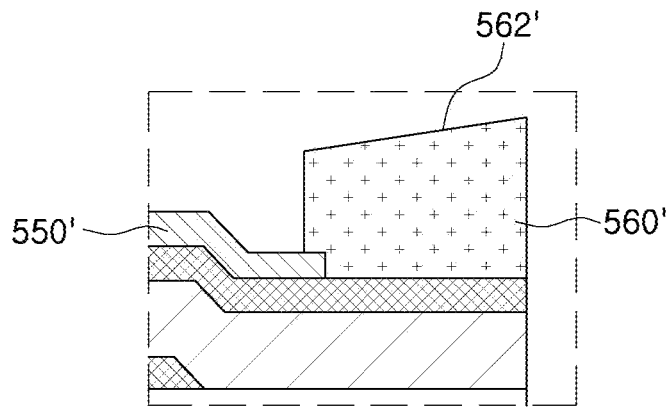
FIG. 28 is an enlarged view illustrating a region corresponding to FIG. 26 after a trimming operation of the related art.

FIG. 27 is an enlarged view illustrating a region corresponding to FIG. 25 after a trimming operation of the related art; and FIG. 28 is an enlarged view illustrating a region corresponding to FIG. 26 after a trimming operation of the related art.

As illustrated in FIGS. 27 and 28, when a trimming operation is performed using the stencil mask of the related art, metal pads 560' are inadvertently trimmed to form inclined surfaces 562'. That is, the metal pads 560' that do not require a trimming operation are nevertheless trimmed together with a passivation layer 550' to form the inclined surfaces 562'. In addition, since the trimming operation is performed on the entire upper surface region of the passivation layer 550' in the region of the passivation layer 550' in which the trimming operation is performed, no step difference is formed in the passivation layer 550'.

In this example, the connection region C illustrated in FIG. 2 is not formed, so the non-trimming-processed region A and the trimming-processed region B are in contact with each other. However, this example is not limited thereto, and the connection region C may be formed between the non-trimming-processed region A and the trimming-processed region B.

The metal pads 560 are formed on portions of the lower electrode 520 and the upper electrode 540 on which the passivation layer 550 is not formed. For example, the metal pads 560 may be formed of a material such as gold (Au), a gold-tin (Au—Sn) alloy, copper (Cu), a copper-tin (Cu—Sn) alloy, aluminum (Al), or an aluminum alloy. For example, the aluminum alloy may be an aluminum-germanium (Al—Ge) alloy.

Figure 29:
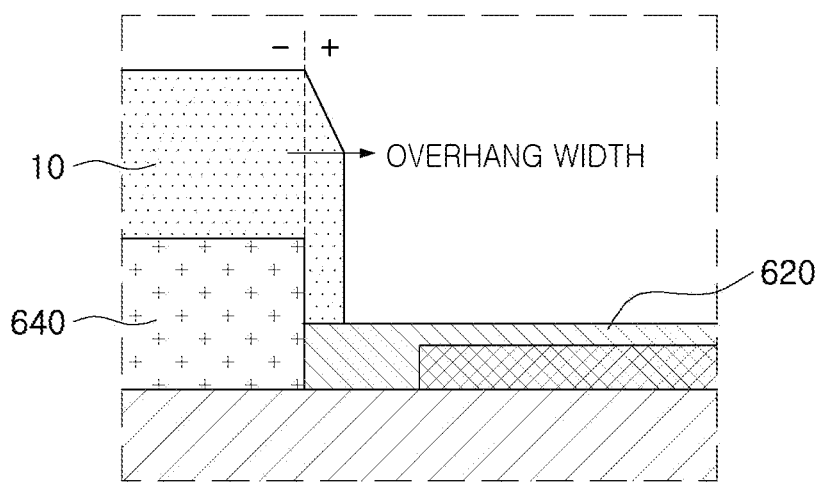
FIG. 29 is an explanatory view for explaining a width of an overhang of a photoresist (PR) trimming mask used to perform a trimming operation in a bulk acoustic wave resonator measured from a boundary line between a passivation layer and a metal pad to an end of the PR trimming mask.
Figure 30:
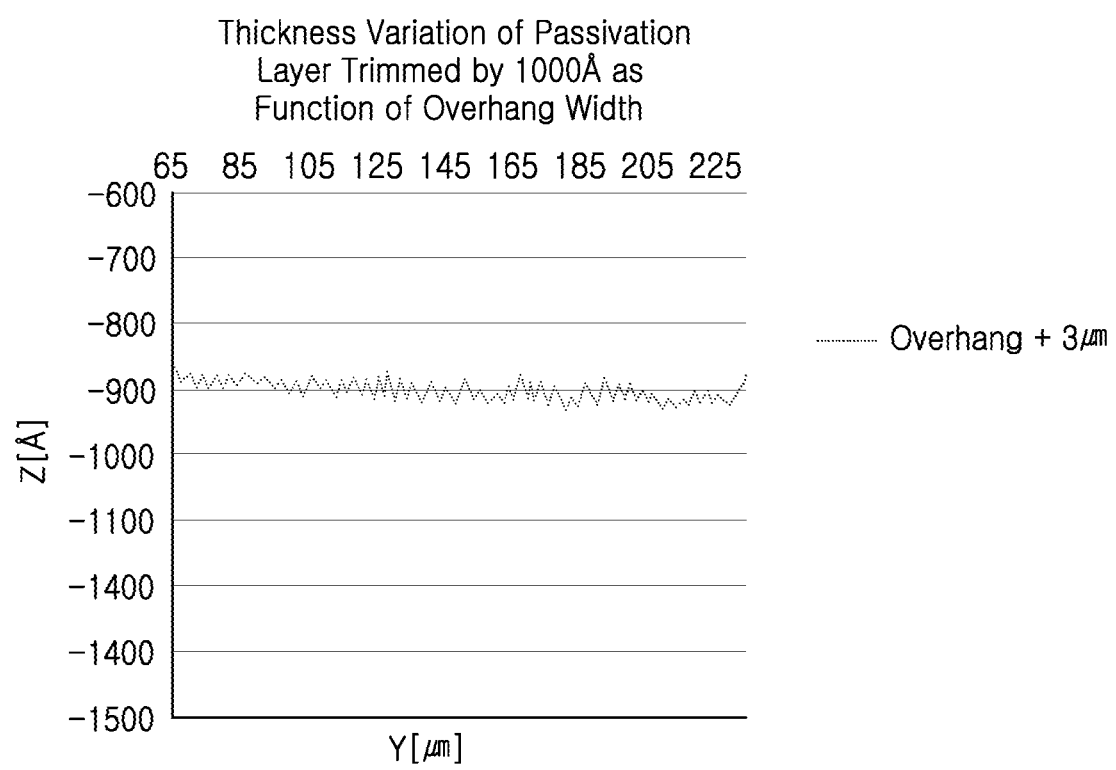
FIGS. 30 to 36 are graphs for explaining a thickness variation of the passivation layer in an active region of the bulk acoustic wave resonator after performing the trimming operation using the PR trimming mask as a function of the width of the overhang measured from the boundary line between the passivation layer and the metal pad to the end of the PR trimming mask as illustrated in FIG. 29.
Figure 31:
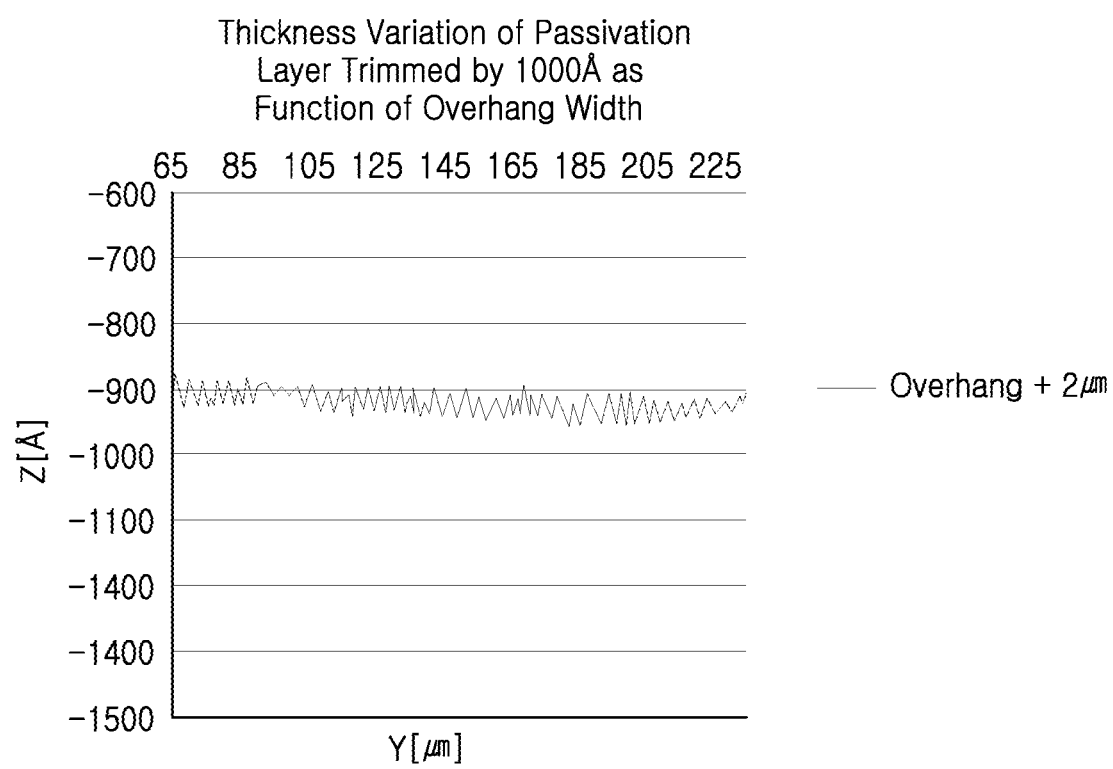
Figure 32:
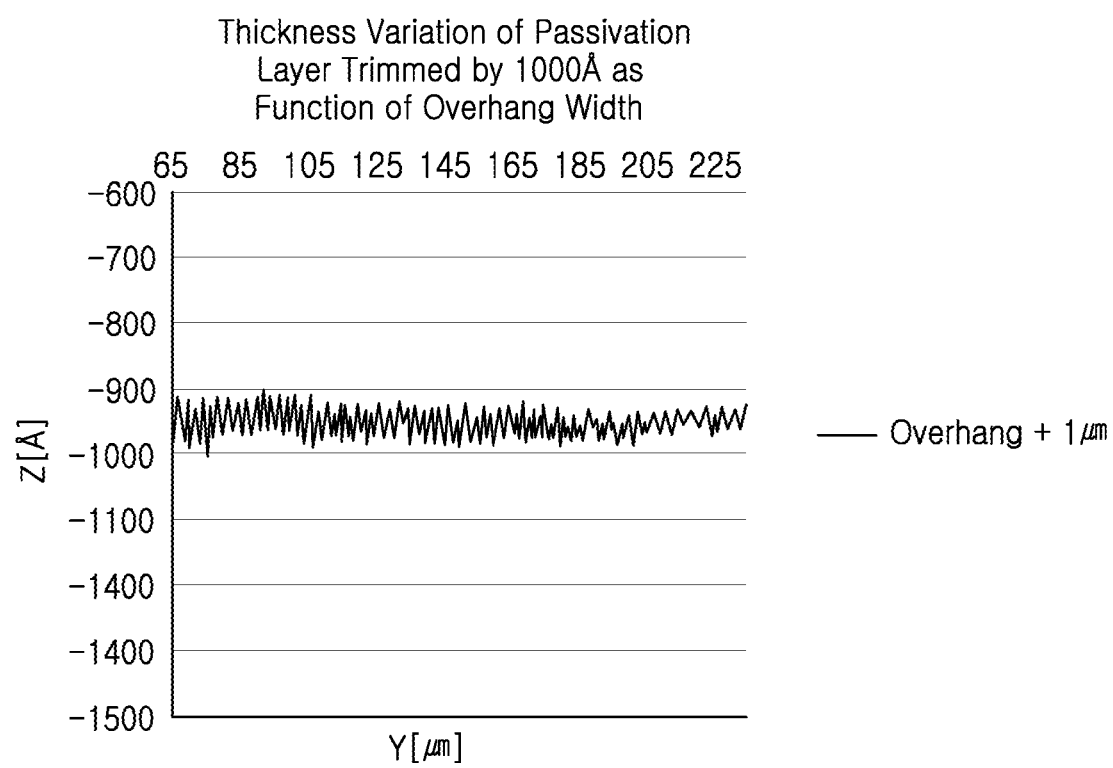
Figure 33:
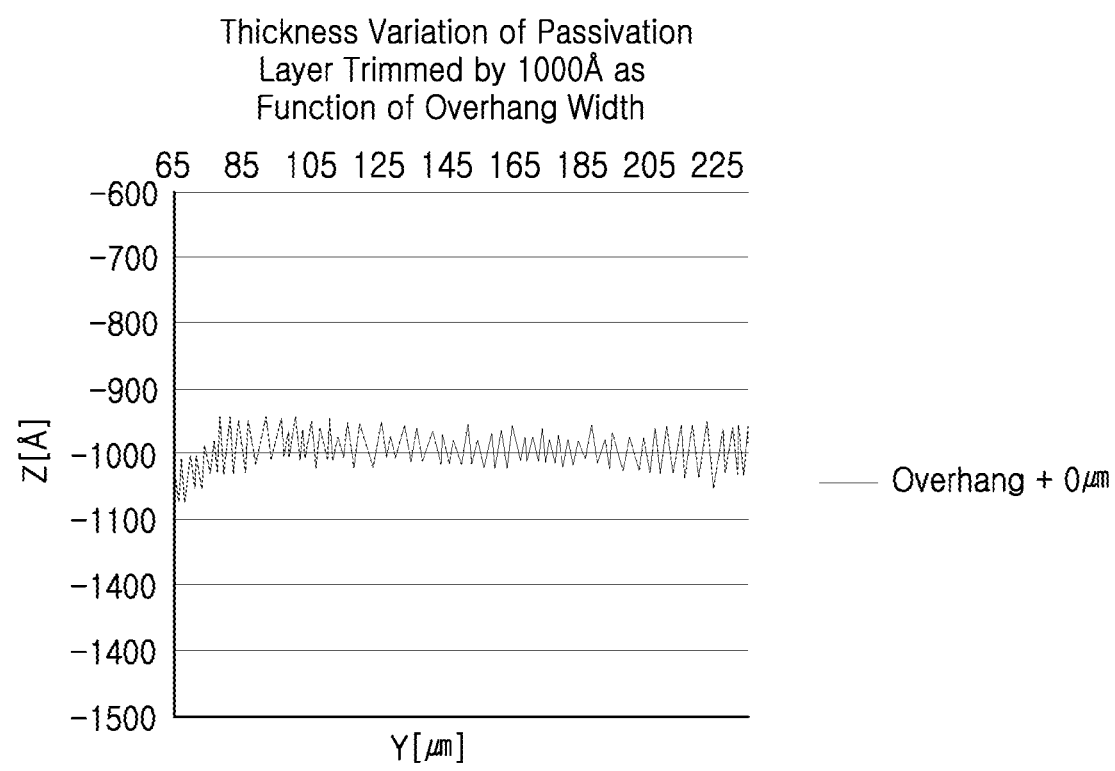
Figure 34:
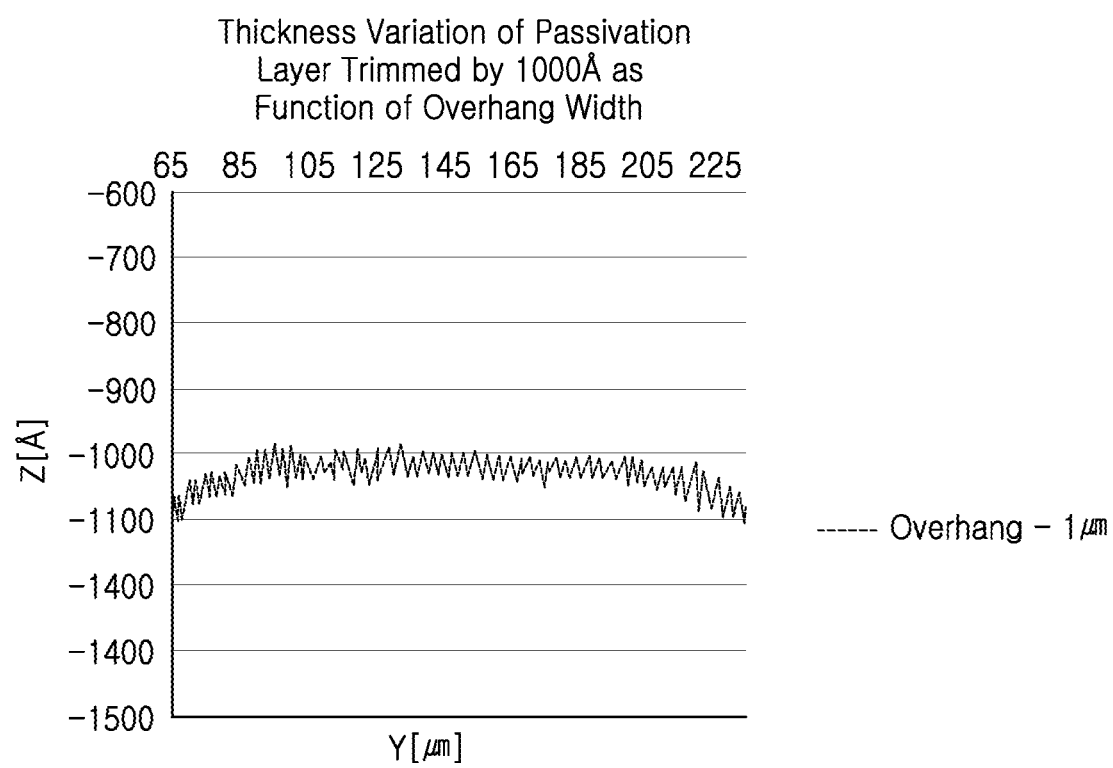
Figure 35:
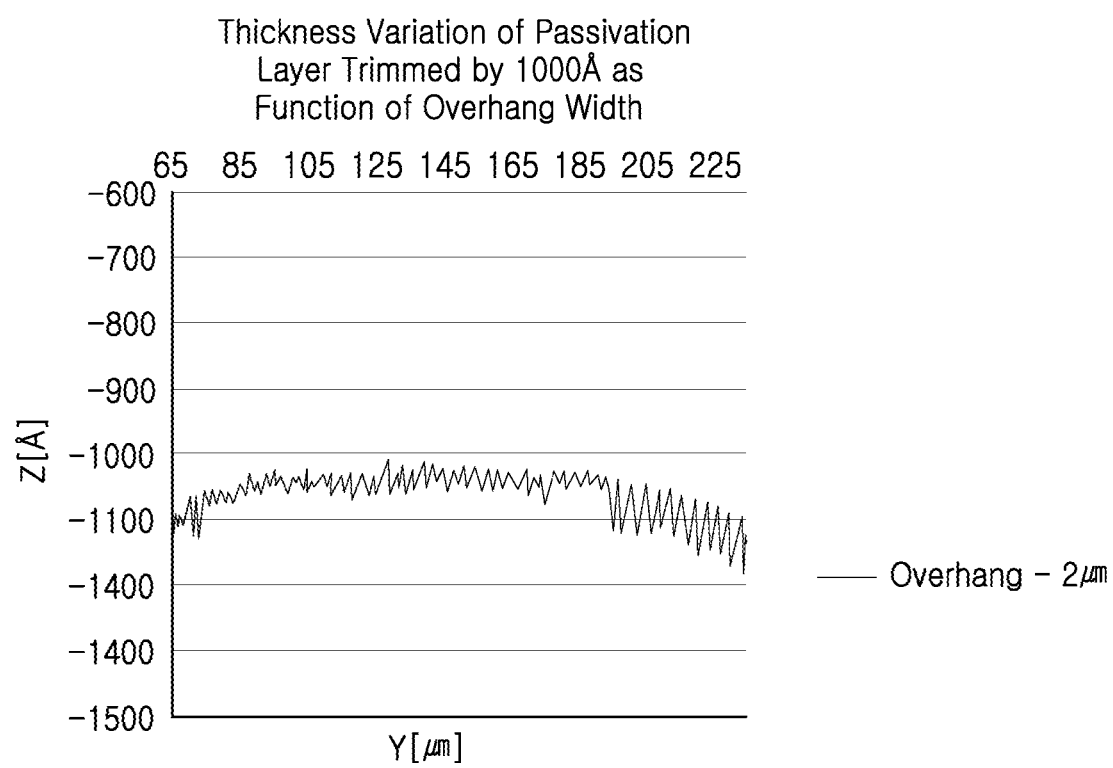
Figure 36:
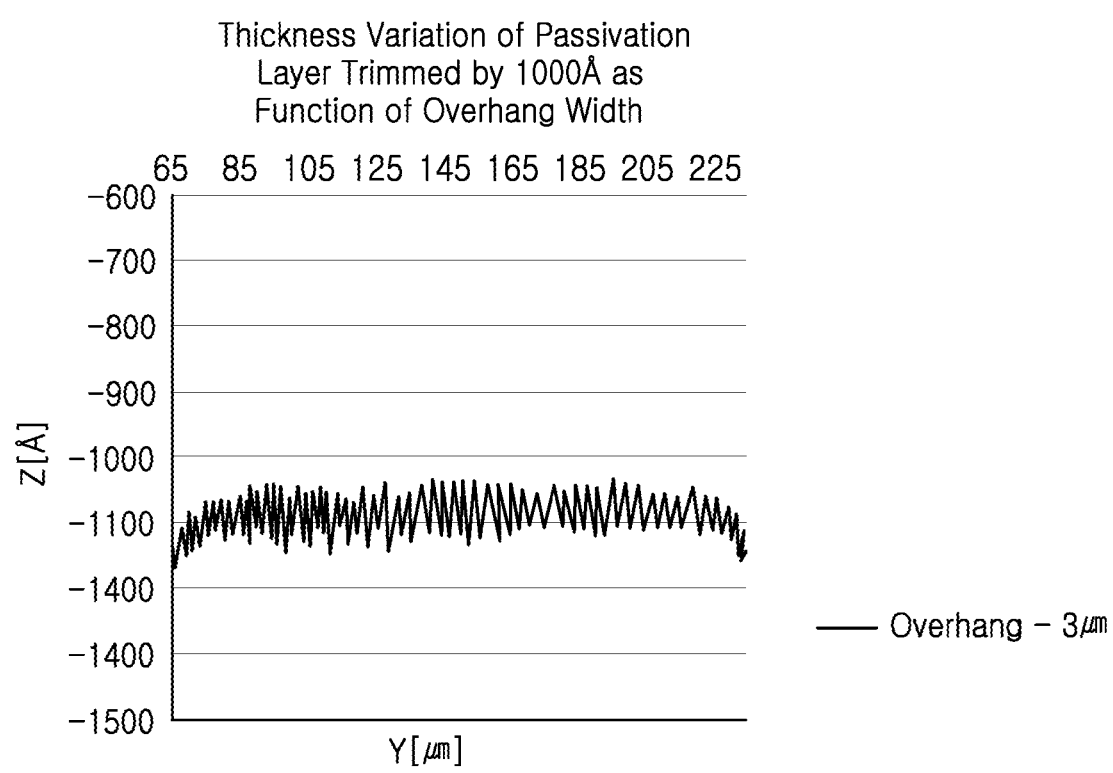

FIG. 29 is an explanatory view for explaining a width of an overhang of a photoresist (PR) trimming mask used to perform a trimming operation in a bulk acoustic wave resonator measured from a boundary line between a passivation layer and a metal pad to an end of the PR trimming mask; and FIGS. 30 to 36 are graphs for explaining a thickness variation of the passivation layer in an active region of the bulk acoustic wave resonator after performing the trimming operation using the PR trimming mask as a function of the width of the overhang measured from the boundary line between the passivation layer and the metal pad to the end of the PR trimming mask as illustrated in FIG. 29.

Referring to FIG. 29, a PR trimming mask 10 is stacked on a bulk acoustic wave resonator to perform a trimming operation on a passivation layer 620. In the example illustrated in FIG. 29, the PR trimming mask 10 is stacked on the passivation layer 620 and a metal pad 640, and thus overhangs the metal pad 640. A width of the overhang is measured from a boundary line between the passivation layer 620 and a metal pad 640 to an end of the PR trimming mask 10. In the example illustrated in FIG. 29, the overhang width has a positive value.

In another example (not illustrated), the PR trimming mask 10 is not stacked on the passivation layer 620, but is stacked only on the metal pad 640 so that the PR trimming mask 10 covers the entire metal pad 640 and the end of the PR trimming mask 10 is aligned with an end of the metal pad 640. In this case, the overhang width has a value of zero.

In another example (not illustrated), the PR trimming mask 10 is not stacked on the passivation layer 620, but is stacked on only a portion of the metal pad 640 and does not cover the entire metal pad 640 so that a portion of the metal pad 640 is exposed. In this case, the overhang width has a negative value.

Referring to FIGS. 30 to 36, a variation in a thickness of the passivation layer 620 after a trimming operation in which the thickness of the passivation layer 620 is trimmed by 1000 Å varies depending on a position in the bulk acoustic wave resonator and the overhang width.

In FIGS. 30 to 36, the X-axis denotes a position Y in an active area of the bulk acoustic wave resonator where a thickness of the passivation layer 620 was measured. Y is expressed in μm relative to a reference position. FIGS. 30 to 36 show values of Y between 65 μm and 225 μm relative to the reference position. The thickness of the passivation layer 620 was measured at an interval of 0.04 μm.

In FIGS. 30 to 36, the Y-axis denotes a value Z that the thickness of the passivation layer 620 after the trimming operation minus the thickness of the passivation layer 620 before the trimming operation. Z is expressed in Å.

FIGS. 30 to 36 respectively show the variation in the thickness of the passivation layer 620 for overhang widths of +3 μm, +2 μm, +1 μm, +0 μm, −1 μm, −2 μm, and −3 μm. For example, it can be seen from FIGS. 30 to 36 that when the overhang width of the PR trimming mask 10 is −3 μm (see FIG. 30), meaning that 3 μm of the metal pad 640 is exposed, the variation in the thickness of the passivation layer 620 is the greatest. Furthermore, it can be seen from FIGS. 30 to 36 that when the overhang width of the PR trimming mask 10 is +1 μm or more (see FIGS. 30 to 32), meaning that the PR trimming mask 10 overhangs the metal pad 640 by 1 μm or more, the variation in the thickness of the passivation layer 620 is reduced. However, when the overhang width is increased to about +2 μm or about +3 μm, it is necessary to provide a larger gap between the metal pad 640 and the region of the passivation layer 620 on which the trimming operation is to be performed to make room for the increased overhang width. Therefore, it is necessary to select an appropriate overhang width in consideration of the design of a particular bulk acoustic wave resonator.

In the examples described above, an abnormal notch in a filter waveform occurring due to the presence of a thickness gradient over a relatively wide region of a passivation layer is suppressed. Furthermore, an abnormal region of amplitude fluctuation in a resonator waveform occurring due to the presence of a thickness gradient over a relatively wide region of the passivation layer is suppressed While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate;
   a lower electrode disposed on the substrate;
   a piezoelectric layer disposed to cover at least a portion of the lower electrode;
   an upper electrode disposed to cover at least a portion of the piezoelectric layer; and
   a passivation layer disposed to cover at least a portion of the upper electrode,
   wherein the passivation layer comprises a non-trimming-processed portion disposed outside an active region of the bulk acoustic wave resonator in which portions of the lower electrode, the piezoelectric layer, and the upper electrode overlap, and having a thickness that is thicker than a thickness of a portion of the passivation layer disposed in the active region, wherein the portion of the passivation layer disposed in the active region constitutes an entirety of the passivation layer disposed in the active region.

2. The bulk acoustic wave resonator of claim 1, wherein the portion of the passivation layer disposed in the active region has a uniform thickness.

3. The bulk acoustic wave resonator of claim 1, wherein the passivation layer further comprises a connection region connecting the portion of the passivation layer disposed in the active region to the non-trimming-processed portion of the passivation layer, and
a width of the connection region is 1 μm or less.

4. The bulk acoustic wave resonator of claim 1, further comprising a metal pad disposed at least on a portion of the lower electrode or a portion of the upper electrode,
wherein the non-trimming-processed portion is disposed between the metal pad and the active region.

5. The bulk acoustic wave resonator of claim 1, wherein the passivation layer is a dielectric layer comprising any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

6. The bulk acoustic wave resonator of claim 1, wherein the non-trimming- processed portion is disposed to surround the active region.

7. The bulk acoustic wave resonator of claim 1, further comprising an insertion layer disposed between the lower electrode and the piezoelectric layer.

8. The bulk acoustic wave resonator of claim 1, further comprising:
a cavity disposed between the active region and the substrate, and
an etching prevention portion disposed to surround the cavity.

9. The bulk acoustic wave resonator of claim 8, further comprising a sacrificial layer disposed to surround the etching prevention portion.

10. The bulk acoustic wave resonator of claim 1, wherein the non-trimming- processed portion is adapted to be covered by a photoresist (PR) trimming mask formed of a photoresist during a trimming operation performed on the portion of the passivation layer disposed in the active region.

11. The bulk acoustic wave resonator of claim 1, further comprising a gap disposed between the piezoelectric layer and the upper electrode,
wherein the active region extends to an end of the gap closest to a center of the bulk acoustic wave resonator.

12. The bulk acoustic wave resonator of claim 11, wherein the piezoelectric layer comprises an etching groove disposed outside the active region.

13. The bulk acoustic wave resonator of claim 11, wherein the substrate comprises a cavity-forming groove that forms a cavity under the active region.

14. The bulk acoustic wave resonator of claim 1, wherein the lower electrode, the piezoelectric layer, and the upper electrode have a bent shape in the active region.

15. The bulk acoustic wave resonator of claim 14, wherein the substrate and a portion of the lower electrode having the bent shape form a cavity together.

16. The bulk acoustic wave resonator of claim 1, further comprising a reflection layer disposed on the substrate under the active region or in a groove formed in the substrate under the active region.

17. The bulk acoustic wave resonator of claim 16, wherein the reflection layer comprises a first reflection member and a second reflection member disposed on the first reflection member, or
the reflection layer comprises a plurality of first reflection members and a plurality of second reflection members disposed in a stack so that the first reflection members alternate with the second reflection members with one of the first reflection members being disposed at one end of the stack and one of the second reflection members being disposed at an opposite end of the stack.

18. A bulk acoustic wave resonator comprising:
a substrate;
a lower electrode disposed on the substrate;
a piezoelectric layer disposed to cover at least a portion of the lower electrode;
an upper electrode disposed to cover at least a portion of the piezoelectric layer;
a passivation layer disposed to cover at least a portion of the upper electrode; and
a metal pad disposed at least on a portion of the lower electrode or a portion of the upper electrode,
wherein the passivation layer comprises a non-trimming-processed portion disposed outside an active region of the bulk acoustic wave resonator in which portions of the lower electrode, the piezoelectric layer, and the upper electrode overlap, and having a thickness that is thicker than a thickness of a portion of the passivation layer disposed in the active region, and
wherein the non-trimming-processed portion is disposed between the metal pad and the active region.

19. A bulk acoustic wave resonator comprising:
a substrate;
a lower electrode disposed on at least a portion of the substrate;
a piezoelectric layer disposed on at least a portion of the lower electrode;
an upper electrode disposed on at least a portion of the piezoelectric layer; and
a passivation layer disposed on at least a portion of the upper electrode,
wherein portions of the lower electrode, the piezoelectric layer, and the upper electrode overlap to form an active region of the bulk acoustic wave resonator,
the passivation layer comprises:
a first portion disposed outside the active region and having a first thickness; and
a second portion disposed in the active region and having a second thickness less than the first thickness, and
a transition between the first thickness and the second thickness occurs over a distance that is sufficiently small to prevent an abnormal region of amplitude fluctuation caused by the transition from occurring in a resonator waveform of the bulk acoustic wave resonator.

20. The bulk acoustic wave resonator of claim 19, wherein the transition between the first thickness and the second thickness occurs over a distance that is substantially equal to zero so that there is a step difference between the first thickness and the second thickness.

21. The bulk acoustic wave resonator of claim 19, wherein the transition between the first thickness and the second thickness occurs over a distance of 1 μm or less.

22. The bulk acoustic wave resonator of claim 19, wherein the second thickness determines an operating frequency of the bulk acoustic wave resonator.

* * * * *